(12) United States Patent
Kern et al.

(10) Patent No.: US 8,856,629 B2
(45) Date of Patent: Oct. 7, 2014

(54) DEVICE AND METHOD FOR TESTING A CIRCUIT TO BE TESTED

(75) Inventors: Thomas Kern, Munich (DE); Ulrich Backhausen, Taufkirchen (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 13/606,919

(22) Filed: Sep. 7, 2012

(65) Prior Publication Data

US 2014/0075272 A1    Mar. 13, 2014

(51) Int. Cl.
 *H03M 13/00* (2006.01)
 *G01R 31/28* (2006.01)
 *G06F 11/00* (2006.01)

(52) U.S. Cl.
 USPC .......................... 714/785; 714/732; 714/801

(58) Field of Classification Search
 USPC ................. 714/781, 785, 793, 732–734, 786, 714/799–801, 807
 See application file for complete search history.

(56) References Cited

U.S. PATENT DOCUMENTS

| | | | | |
|---|---|---|---|---|
| 4,335,459 A * | 6/1982 | Miller | ............................ | 714/755 |
| 4,599,722 A * | 7/1986 | Mortimer | ....................... | 714/776 |
| 5,515,383 A | 5/1996 | Katoozi | | |
| 7,320,100 B2 * | 1/2008 | Dixon et al. | ................... | 714/758 |
| 8,010,875 B2 * | 8/2011 | Gara et al. | ..................... | 714/773 |

FOREIGN PATENT DOCUMENTS

| | | |
|---|---|---|
| CN | 1368731 A | 9/2002 |
| CN | 1947098 A | 4/2007 |
| CN | 101128802 A | 2/2008 |

* cited by examiner

*Primary Examiner* — Christine Tu
(74) *Attorney, Agent, or Firm* — Eschweiler & Associates, LLC

(57) ABSTRACT

A device for testing a circuit includes a syndrome determiner, a test sequence provider and an evaluation circuit. The syndrome determiner determines an error syndrome bit sequence (s(v')) based on a coded binary word (v'). The error syndrome bit sequence (s(v')) indicates whether the coded binary word (v') is a code word of an error correction code (C) used for coding the coded binary word (v'). The test sequence provider provides a test bit sequence ($T_i$) of the circuit that is different than the error syndrome bit sequence (s(v')), if the error syndrome bit sequence (s(v')) indicates that the coded binary word (v') is a code word of the error correction code (C). The evaluation circuit detects an erroneous processing of the test bit sequence ($T_i$) by the circuit based on a test output signal ($R(T_i)'$)—caused by the test bit sequence ($T_i$)—of the circuit.

22 Claims, 12 Drawing Sheets

US 8,856,629 B2

DEVICE AND METHOD FOR TESTING A CIRCUIT TO BE TESTED

FIELD the invention relates to the field of error correction and error detection in binary signals, and in particular to a device and a method for testing a circuit to be tested.

BACKGROUND

On account of further miniaturization of components of integrated circuits and the lower voltage values and current values associated therewith, errors increasingly occur in integrated circuits and also specifically in circuits for error correction or for error detection.

Such errors can have the effect that a false correction takes place, even though no erroneous code word at all is present at the input of the correction circuit, which is disadvantageous. If an error is erroneously indicated on account of a faulty error detection circuit, then measures at the system level may be initiated unnecessarily, which is likewise disadvantageous.

By adding redundancy in electronic circuits it is possible to detect a static or temporary error in the circuits. In this case, however, the additional hardware outlay is intended to be kept as low as possible in conjunction with high detection probability.

SUMMARY

The present invention provides an improved concept for testing electrical circuits which makes it possible to increase the error detection properties in conjunction with little additional hardware outlay and/or little additional computational time.

One exemplary embodiment provides a device for testing a circuit to be tested, comprising a syndrome determiner, a test sequence provider and an evaluation circuit. The syndrome determiner is designed to determine an error syndrome bit sequence based on a coded binary word. The error syndrome bit sequence indicates whether the coded binary word is a code word of an error correction code used for coding the coded binary word. Furthermore, the test sequence provider is configured to provide at least once a test bit sequence of the circuit to be tested, wherein the test bit sequence is different than the error syndrome bit sequence determined, if the error syndrome bit sequence indicates that the coded binary word is a code word of the error correction code. Furthermore, the evaluation circuit is configured to detect an erroneous processing of the test bit sequence by the circuit to be tested, based on a test output signal—caused by the test bit sequence—of the circuit to be tested.

By providing a test bit sequence at points in time when the coded binary word has no error and is thus a code word of the error correction code, the time in which no correction of the coded binary word is necessary can be used for testing the circuit to be tested. As a result, it is possible to check that the circuit to be tested is free of errors with only little additional or without additional computational time. In addition, the requisite hardware outlay can be kept low since the test sequence provider and the evaluation circuit can be realized with little outlay.

BRIEF DESCRIPTION OF THE DRAWINGS

Exemplary embodiments are explained below with reference to the accompanying figures, in which.

DETAILED DESCRIPTION

Figure 1:
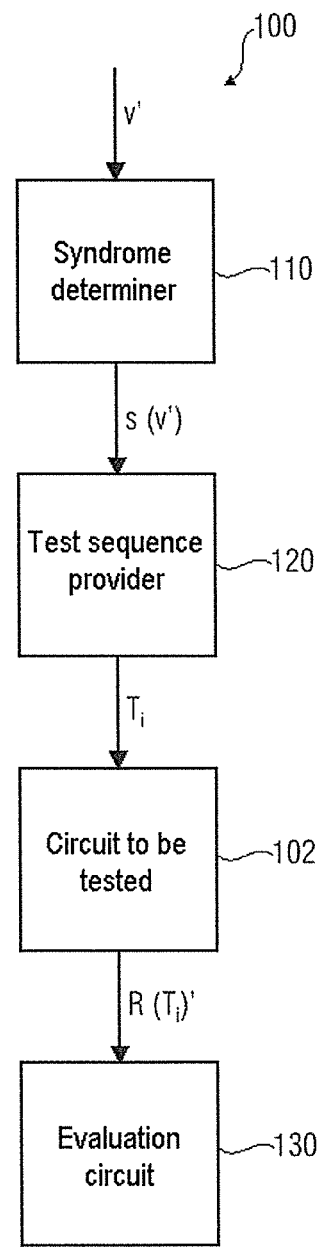
FIG. 1 shows a block diagram of a device for testing a circuit to be tested.

The concept described below relates generally to the processing of coded data that are coded using a code C. The following introduction serves, in particular, to explain how the customary terms from coding theory are used here.

If C is e.g. a linear (n, k) code, i.e. a linear code of length n having k information bits and n−k=m check bits, then the code C can be described by an (m, n) parity check matrix H and a (k, n) generator matrix G.

If the data bits or information bits to be coded are described by $u=u_1, \ldots u_k$, then the code word $v=v_1, \ldots, v_n$ is formed from the information bits u according to the relationship $$v = u \cdot G$$

A syndrome $s(v')=s_1(v'), \ldots, s_m(v')$ is assigned to an n-digit word $v'=v'_1, \ldots, v'_n$, which is either a code word of the code C or is a non-code word of the code C, by means of $$s(v')^T = H \cdot v'^T$$

In this case, $v'^T$ denotes the transposed column vector of the row vector v' and $s(v')^T$ denotes the transposed column vector of the row vector $S(v')$.

A word v' is a code word precisely when its syndrome is equal to 0, i.e. when $$H \cdot v'^T = 0$$

holds true.

If a code word v is disturbed into a non-code word v' and the following holds true $$v' = v'_1, \ldots, v'_n = v_1 \oplus e_1, \ldots, v_n \oplus e_n = v \oplus e$$

then $e = e_1, \ldots, e_n$ is called an error vector. The components of e which are equal to 1 indicate the bits that are disturbed.

For the syndrome s(v') the following then holds true $$s(v') = H \cdot v'^T = H \cdot [v \oplus e]^T = H \cdot e^T$$

and the error syndrome is determined from the error vector.

In the usually implemented correction of errors of a word $v'=v \oplus e$ by means of an error correcting code C, firstly the error syndrome $s(v')$ is determined in a syndrome generator. If the error syndrome is equal to 0, then no detectable error is present. If the error syndrome is not equal to 0, then an error can be detected. On the basis of the error syndrome, therefore, it is possible to ascertain in a simple manner, by checking the syndrome for 0, whether or not an error detectable by the code C under consideration is present.

A decoder (decoding unit) then assigns to the error syndrome $s(v')$ the bits that are to be corrected in $v'$. They are precisely those bits of the error vector which are equal to 1. This procedure is successful when the errors that occurred can be corrected by the chosen code. Furthermore, error correction circuits also have circuits for determining the error type, which indicate what type of error has occurred. By way of example, an error type indicator can indicate that a 1-bit error, a 2-bit error, a 3-bit error or some other multi-bit error has occurred. The error type is determined based on the error syndrome.

In the cases in which errors rarely occur at the inputs of the syndrome generator, the value 0 is practically always present at the output of the syndrome generator. If, for example, a permanent stuck-at-0 error is then present on output lines of the syndrome generator, such an error does not have an effect as long as no non-code word is present at the input of the syndrome generator. However, this permanent error can corrupt an erroneous syndrome, determined by a non-code word present, to 0, such that an error in the input values of the syndrome generator then cannot be detected, nor can the incorrect bits be corrected by the decoder. Furthermore, at the further subcircuits such as, for example, the decoder, the error type determiner, the values 0 are always then present in their input as long as no error has occurred on the input lines of the syndrome generator. If such an error occurs very rarely, then the same value, here 0, is practically always input into the decoder and into the error type determiner, such that errors present in these circuit sections in the course of operation cannot have an effect on the outputs of the subcircuits, nor can they be detected, which is disadvantageous.

In order to avoid such a situation where the value 0 practically always occurs at the outputs of the syndrome generator, the H-matrix of the code C can be modified into a matrix H mod, for example by a column of the H-matrix of the code C being inverted component by component. If the i-th column of the H-matrix has been inverted, then a code word $v^{i0}$ whose i-th component is equal to 0 leads to an error syndrome $$s(v^{i0})^T = H_{mod} \cdot (v^{i0})^T = \underbrace{(0, \ldots, 0)^T}_{n}$$

while a code word $v^{i1}$ whose i-th component is equal to 1 leads to a syndrome $$s(v^{i1})^T = H_{mod} \cdot (v^{i1})^T = \underbrace{(1, \ldots, 1)^T}_{n}$$

Therefore, as long as a code word of the code C is present at the input of the syndrome generator and the syndrome generator operates correctly, it outputs either the value $$\underbrace{(1, \ldots, 1)^T}_{n}$$

or the value $$\underbrace{(0, \ldots, 0)^T}_{n}.$$

Stuck-at 0/1 errors at the outputs of the syndrome generator can be detected in this way, even if only correct code words are input into the syndrome generator. Generally, a subset of the columns of the H-matrix can be inverted component by component. If the $i_1$-th, the $i_2$-th, ..., the $i_r$-th columns of the H-matrix are inverted component by component, then the modified syndrome generator outputs the value $$\underbrace{(0, \ldots, 0)^T}_{n}$$

if for a code word $v=v_1, \ldots, v_n$ $$f(v_1, \ldots, v_n) = v_{i1} \oplus v_{i2} \oplus \ldots \oplus v_{ir} = 0$$

and outputs the value $$\underbrace{(1, \ldots, 1)^T}_{n}$$

if $$f(v_1, \ldots, v_n) = v_{i1} \oplus v_{i2} \oplus \ldots \oplus v_{ir} = 1$$

It is possible, then, to use the modified H-matrix Hmod for determining the error syndrome and for error detection and thereby to avoid a situation in which the same value is always output at the output in the error-free case as long as an error-free code word is present at the input of the syndrome generator.

In order to provide a better understanding, the determination of a modified H-matrix will be described here on the basis of a simple example.

In order to explain the procedure in detail, a shortened hamming code with the (4,9) H-matrix H $$H = \begin{pmatrix} 1 & 1 & 0 & 1 & 1 & 1 & 0 & 0 & 0 \\ 1 & 0 & 1 & 1 & 0 & 0 & 1 & 0 & 0 \\ 0 & 1 & 1 & 1 & 0 & 0 & 0 & 1 & 0 \\ 0 & 0 & 0 & 0 & 1 & 0 & 0 & 0 & 1 \end{pmatrix}$$

and with the (5,9) G-matrix G $$G = \begin{pmatrix} 1 & 0 & 0 & 0 & 0 & 1 & 1 & 0 & 0 \\ 0 & 1 & 0 & 0 & 0 & 1 & 0 & 1 & 0 \\ 0 & 0 & 1 & 0 & 0 & 0 & 1 & 1 & 0 \\ 0 & 0 & 0 & 1 & 0 & 1 & 1 & 1 & 0 \\ 0 & 0 & 0 & 0 & 1 & 1 & 0 & 0 & 1 \end{pmatrix}$$

is now considered as an example of an error correcting code. The code word $v=v_1, \ldots, v_9$ where $v=u \cdot G=u, c$ with the check bits $c=c_1, \ldots, c_4$ is assigned to the information bits $u=u_1, \ldots, u_5$, wherein $$c_1 = v_1 \oplus v_2 \oplus v_4 \oplus v_5$$

$$c_2 = v_1 \oplus v_3 \oplus v_4$$

$$c_3 = v_2 \oplus v_3 \oplus v_4$$

$$c_4 = v_5$$

The two words v=110110001 and v'=1011001000 are valid code words since $H \cdot v^T = 0$ and $H \cdot v'^T = 0$ hold true.

As a subset of the columns which are inverted component by component in order to form the modified H-matrix $H_{mod}$, we will choose here the second column of H. For $H_{mod}$ the following then holds true $$H_{mod} = \begin{pmatrix} 1 & 0 & 0 & 1 & 1 & 1 & 0 & 0 & 0 \\ 1 & 1 & 1 & 1 & 0 & 0 & 1 & 0 & 0 \\ 0 & 0 & 1 & 1 & 0 & 0 & 0 & 1 & 0 \\ 0 & 1 & 0 & 0 & 1 & 0 & 0 & 0 & 1 \end{pmatrix}.$$

To summarize, the syndrome s(v') of a word v' for a linear code C is determined by the relationship $$s(v') = K \cdot v'^T$$

wherein the (m, n) matrix K is identical to the parity check matrix H of the code C if the syndrome generator always outputs the value $$\underbrace{(0, \ldots, 0)}_{m}$$

when a code word is input, and is identical to a modified parity check matrix $H_{mod}$ derived from the parity check matrix H by the components of a subset of the columns of H being inverted component by component if the syndrome generator outputs either $$\underbrace{(0, \ldots, 0)}_{m}$$

or $$\underbrace{(1, \ldots, 1)}_{m}$$

when different code words are input. If the $i_1$-th, $i_2$-th, ..., the $i_q$-th columns of the H-matrix are inverted component by component, then the modified syndrome generator outputs in a manner dependent on the function value of the function $$f(v'_1, \ldots, v'_n) = v_{i_1} \oplus v_{i_2} \ldots \oplus v_{i_q}$$

the value $$\underbrace{(0, \ldots, 0)^T}_{n}$$

or the value $$\underbrace{(1, \ldots, 1)^T}_{n}.$$

Identical reference signs are used hereinafter in part for objects and functional units which have identical or similar functional properties. Furthermore, optional features of the various exemplary embodiments can be combinable with one another or interchangeable.

FIG. 1 shows a block diagram of a device 100 for testing a circuit 102 to be tested in accordance with one example embodiment. The device 100 comprises a syndrome determiner 110, a test sequence provider 120 and an evaluation circuit 130. The syndrome determiner 110 determines an error syndrome bit sequence s(v') based on a coded binary word v'. In this case, the error syndrome bit sequence s(v') indicates whether the coded binary word v' is a code word of an error correction code C used for coding the coded binary word v'. Furthermore, the test sequence provider 120 provides at least once a test bit sequence $T_i$ of the circuit 102 to be tested, wherein the test bit sequence is different than the error syndrome bit sequence s(v') determined, if the error syndrome bit sequence s(v') indicates that the coded binary word v' is a code word of the error correction code C. Furthermore, the evaluation circuit 130 detects an erroneous processing of the test bit sequence $T_i$ by the circuit 102 to be tested, based on a test output signal $R(T_i)'$—caused by the test bit sequence $T_i$—of the circuit 102 to be tested.

By providing a test bit sequence $T_i$ to the circuit 102 to be tested while the coded binary word is a correct code word of the error correction code C, those times when no error correction of the coded binary word is necessary can be used for testing the circuit to be tested.

In this case, the circuit 102 to be tested can be, for example, part of an error detection and/or error correction circuit. It is thereby possible to detect static and temporary errors in the circuit to be tested without or with only little additional expenditure in terms of time. In addition, the supplementary hardware outlay primarily for the test sequence provider 120 and the evaluation circuit 130 can be kept low.

In other words, by means of the concept described, an improvement in the error detection, in particular in circuit sections of circuits for error detection and error correction, can be made possible by virtue of the fact that circuit sections can be tested in the course of operation with arbitrarily predefined test bit sequences (test inputs), without the normal operation of the overall circuit having to be interrupted.

The circuit 102 to be tested can be part of the device 100 for testing the circuit to be tested, although that is not necessary, since the proposed concept can be applied independently of the circuit 102 to be tested. As part of an error detection and/or error correction circuit, the circuit 102 to be tested can be, for example, a decoder (decoding unit) for generating a correction signal for correcting an erroneous coded binary word v' or an error type determiner for determining an error type of an erroneous coded binary word v'.

The error syndrome bit sequence s(v') indicates or specifies whether the coded binary word v' is a code word of the error correction code C. In this case, the error syndrome bit sequence s(v') assumes the value of a predefined error syndrome bit sequence if the coded binary word v' is a code word of the error correction code C. This can always be exactly the same predefined error syndrome bit sequence (e.g. 0000 or 1111) or a predefined error syndrome bit sequence from a plurality of error syndrome bit sequences. By way of example, for two different groups of code words of the error correction code C, it is possible to provide two different predefined error syndrome bit sequences (e.g. the bit sequence 0000 for a first portion of the code words and the bit sequence 1111 for a second portion of the code words). In other words, the syndrome determiner 110 can determine the error syndrome bit sequence s(v'), such that the error syndrome bit sequence s(v') for a first plurality of code words of the error correction code C is identical to a first predefined error syndrome bit sequence and the error syndrome bit sequence s(v') for a second plurality of code words of the error correction code C is identical to a second predefined error syndrome bit sequence. In this case, the first predefined error syndrome bit sequence and the second error syndrome bit sequence differ. Furthermore, the first plurality of code words and the second plurality of code words have no common code words. Alternatively, the syndrome determiner 110 can determine the error syndrome bit sequence s(v') for example such that the error syndrome bit sequence s(v') is always identical to exactly one predefined error syndrome bit sequence if the coded binary word v' is a code word of the error correction code C.

The error syndrome bit sequence s(v') can be generated, for example, with the aid of the parity check matrix H of the error correction code C. In other words, the syndrome determiner 110 can determine the error syndrome bit sequence s(v') on the basis of a multiplication of a parity check matrix H of the error correction code C by the coded binary word v' or a multiplication of a parity check matrix K, inverted component by component at least in one column (or in a row in the case of a transposed parity check matrix), of the error correction code C by the coded binary word v'.

The error correction code C can be, in principle, any desired error correction code. By way of example, the error correction code C can be a linear error correction code (e.g. hamming code).

The test bit sequence $T_i$ can be, in principle, any desired bit sequence about which it is known entirely or at least in part (e.g. upon considering only a subset of the bits of the test output signal) what test output signal the circuit 102 to be tested outputs in reaction to the test sequence $T_i$ if the circuit 102 to be tested operates in an error-free manner. The test sequence $T_i$ can be, for example, identical to an error syndrome bit sequence s(v') for a coded binary word v' that is not a code word of the error correction code C. This makes it possible, for example, to test whether the circuit 102 to be tested would operate correctly if the syndrome determiner 110 output this error syndrome bit sequence s(v'). If, by way of example, the circuit to be tested is an error detection and/or error correction circuit or part of such a circuit, it is possible to ascertain whether this circuit would operate correctly for an error simulated by the test bit sequence in the coded binary word.

If the circuit 102 to be tested is an error detection and/or error correction circuit or part of such a circuit, then the test sequence provider 120 can provide the error syndrome bit sequence of the circuit 102 to be tested if an error in the binary word is detected by means of the error syndrome bit sequence. This error can then be corrected by the error correction circuit, for example. The test sequence provider 120 can therefore provide the test bit sequence $T_i$ if the coded binary word has no error, and can provide the error syndrome bit sequence s(v') if the coded binary word v' has an error, that is to say does not correspond to a code word of the error correction code. In other words, the test sequence provider 120 can provide the error syndrome bit sequence s(v') of the circuit 102 to be tested if the error syndrome bit sequence s(v') indicates that the coded binary word v' is not a code word of the error correction code C. Alternatively, by way of example, the syndrome determiner 110 can also provide the error syndrome bit sequence s(v') directly to the circuit 102 to be tested. The circuit 102 to be tested processes the error syndrome bit sequence s(v') if the coded binary word is not a code word, and processes the test bit sequence $T_i$ if the coded binary word v' is a code word.

The test sequence provider 120 does not have to provide a test bit sequence $T_i$ to the circuit 102 to be tested whenever the coded binary word v' is a code word of the error correction code. In principle, the proposed concept is already realized by a single provision, but the test coverage and the probability of detecting an erroneous processing of a test bit sequence $T_i$ can be increased if a test bit sequence $T_i$ is provided more often. By way of example, the test sequence provider 120 can provide, at least to the extent of 10%, 20%, 50% or 80%, a test bit sequence $T_i$ of the circuit 102 to be tested, wherein the test bit sequence is different than the error syndrome bit sequence s(v') determined, if the error syndrome bit sequence s(v') indicates that the coded binary word v' is a code word of the error correction code C. Alternatively, the test sequence provider 120 can also always provide a test bit sequence $T_i$ if the coded binary word v' is a code word.

Here the test sequence provider 120 can provide, for example, in each case a different test bit sequence $T_i$ (which differs from the preceding test bit sequence) from a plurality of test bit sequences if the coded binary word is a code word. In other words, the test sequence provider 120 can provide a respective test bit sequence $T_i$ from a plurality of test bit sequences for each coded binary word v' which the syndrome determiner 110 processes, and which is a code word of the error correction code C, of the circuit 102 to be tested. The plurality of test bit sequences can, for example, be stored in a memory or be generated by a linear feedback shift register. In other words, the test sequence provider 120 can have a memory that stores and provides the plurality of test bit sequences, or can have a linear feedback shift register that makes it possible to generate a test bit sequence $T_i$ of the plurality of test bit sequences.

The evaluation circuit 130 can detect an error in the circuit 102 to be tested, based on the test output signal $R(T_i)'$. For this purpose, the evaluation circuit 130 can, for example, compare the test output signal $R(T_i)'$ or a signal derived from the test output signal $R(T_i)'$ with an expected reference test signal $R(T_i)$. If the test output signal $R(T_i)'$ or the signal derived therefrom does not correspond to the expected reference test signal $R(T_i)$, then an erroneous processing of the test bit sequence $T_i$ by the circuit 102 to be tested is detected. The evaluation circuit can output a corresponding error signal. In other words, the evaluation circuit 130 can compare the test output signal $R(T_i)'$ or a processed or reduced test output signal based on the test output signal $R(T_i)'$ with an expected reference test signal $R(T_i)$ and detect an erroneous processing of the test bit sequence $T_i$ if the test output signal $R(T_i)'$ or the processed or reduced test output signal does not correspond to the expected reference test signal $R(T_i)$. In this case, the processed or reduced test output signal can be a bit sequence which can be obtained by means of a logical function of the bits of the test output signal $R(T_i)'$ or which contains only a subset of the bits of the test output signal $R(T_i)'$. In this case, the subset of bits of the test output signal $R(T_i)'$ relates to the bit width of the test output signal $R(T_i)'$.

In some example embodiments, the error correction code C is based on an inversion of one or more columns of the parity check matrix H, as already described above. In such cases, the test sequence provider 120 can have a bit sequence inverter, for example, which compensates for the partial inversion of the columns (or rows in a transposed parity check matrix) of the parity check matrix for the further processing. In other words, the test sequence provider 120 can have a bit sequence inverter that inverts the test bit sequence $T_i$ or the error syndrome bit sequence s(v') on the basis of a function f(v') of a subset of bits of the coded binary word v'. In this case, the function f(v') of the subset of bits can be chosen, for example, such that the bit sequence inverter does not invert the test bit sequence $T_i$ if the error syndrome bit sequence s(v') is identical to the first predefined error syndrome bit sequence, and inverts the test bit sequence $T_i$ if the error syndrome bit sequence s(v') is identical to the second predefined error syndrome bit sequence. This is one example of a possible function f(v') if the error syndrome bit sequence for different code words of the error correction code can assume two different error syndrome bit sequences s(v').

Figure 2:
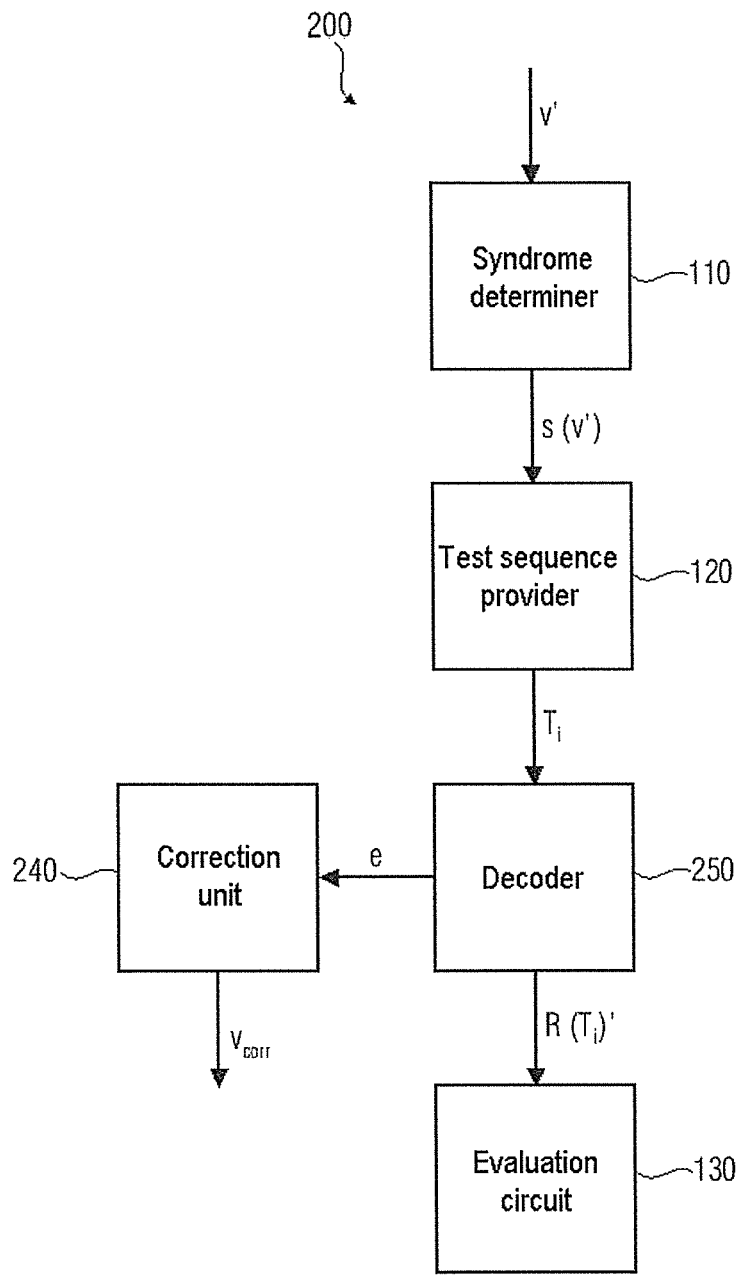
FIG. 2 shows a block diagram of a device for correcting a bit error in a coded binary word.

FIG. 2 shows a block diagram of a device 200 for correcting a bit error in a coded binary word v' in accordance with one example embodiment. The device 200 comprises a device for testing a circuit to be tested according to the concept described above, and also a decoder 250 as circuit to be tested and a correction unit 240. The syndrome determiner 110 is connected to the test sequence provider 120, the test sequence provider 120 is connected to the decoder 250 and the decoder 250 is connected to the correction unit 240 and the evaluation circuit 130. The decoder 250 generates an output signal based on the error syndrome bit sequence s(v'), such that the output signal of the decoder 250 represents a correction signal e for the coded binary word v' if the error syndrome bit sequence s(v') indicates that the coded binary word v' is not a code word of the error correction code C. The decoder 250 corresponds to the circuit to be tested and the output signal of the decoder 250 corresponds to the test output signal $R(T_i)'$ if the error syndrome bit sequence s(v') indicates that the coded binary word v' is a code word of the error correction code C. Furthermore, the correction unit 240 corrects a bit error in the coded binary word v' based on the coded binary word v' and the correction signal e and outputs a corrected coded binary word $v_{corr}$.

In other words, if an erroneous coded binary word v' is present, then the decoder 250 outputs a correction signal e to the correction unit 240 and the correction unit 240 corrects the error in the coded binary word and outputs a corrected coded binary word $v_{corr}$ (if the error is an error that can be corrected by the error correction code; e.g. a 1-bit error when a 1-bit error correcting code is used). However, if an error-free coded binary word is present, then the test sequence provider 120 provides a test bit sequence $T_i$ to the decoder 250, which thereupon outputs the test output signal $R(T_i)'$, which is used by the evaluation circuit 130 to detect an erroneous processing of the test bit sequence $T_i$ by the decoder 250.

The syndrome determiner 110, the test sequence provider 120, the evaluation circuit 130, the correction unit 240 and/or the decoder 250 can be embodied, for example, as independent hardware units or as part of a computer, microcontroller or digital signal processor and as a computer program or a software product for execution on a computer, a microcontroller or digital signal processor. The syndrome determiner 110, the test sequence provider 120, the evaluation circuit 130, the correction unit 240 and/or the decoder 250 can, for example, also be realized jointly in part.

The proposed concept is explained in greater detail below based on a plurality of detailed embodiments. However, the described details can also be applied independently of one another both to a device for testing a circuit to be tested and to a device for correcting a bit error in a coded binary word. Likewise, the different aspects of the different exemplary embodiments can be combined with one another.

Figure 3:
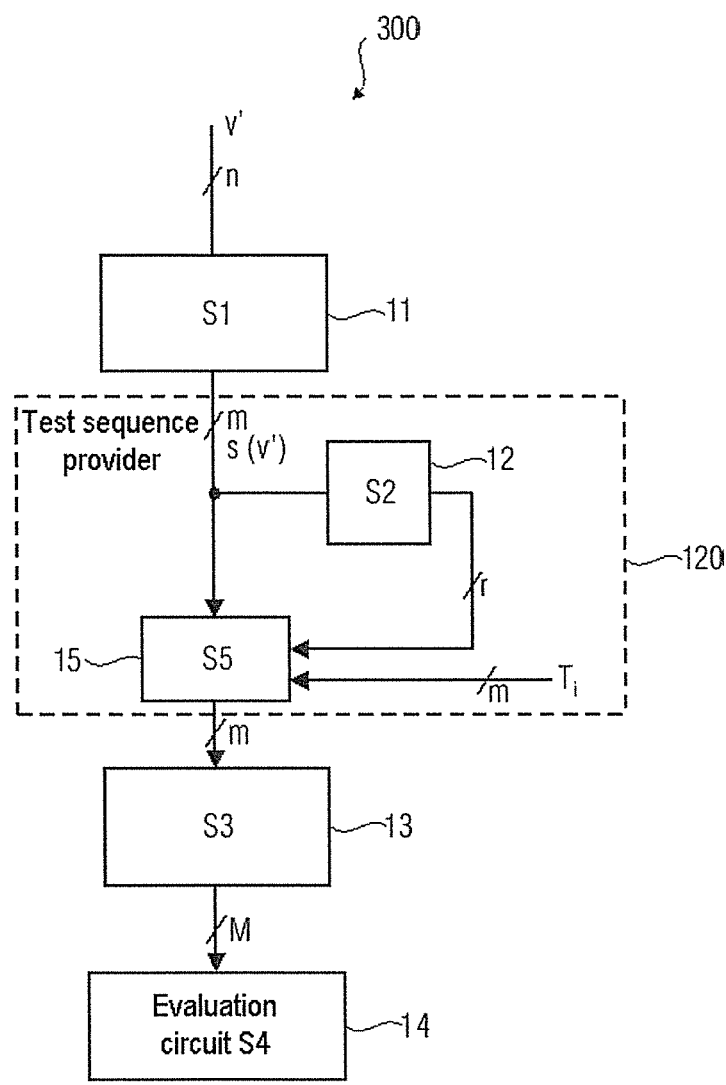
FIG. 3 shows a block diagram of a device for testing a circuit to be tested.

FIG. 3 shows a first detailed circuit arrangement 300 for the case where the matrix K is identical to the parity check matrix H of the code C. It comprises the subcircuits S1 11 (syndrome determiner), S2 12 (error syndrome detector), S3 13 (circuit to be tested), S4 14 (evaluation circuit) and S5 15. The n bit wide coded data v' are present at the n binary inputs of the first subcircuit S1 11 for forming a syndrome s, wherein the data is processed in the circuit S1 to form an m bit wide syndrome s(v'). In this case, the circuit S1 is configured such that s(v)≠s(v') holds true if v is a code word of the code C and v' is not a code word of the code C. Since K is identical to the parity check matrix H of the code C, the syndrome of a code word is always equal to 0 here, and the syndrome of a non-code word is not equal to 0. The test sequence provider 120 is formed by the subcircuit S2 12 and the subcircuit S5 15.

The m bit wide output of the first subcircuit S1 is led into the m bit wide input of the circuit for error detection S2 12 (error syndrome detector) and simultaneously into the m bit wide first input of the subcircuit S5 15. The circuit for error detection S2 12 outputs different error signals at its r bit wide output if a syndrome s(v) of a code word of the code C or a syndrome s(v') of a non-code word of the code C is present at its m bit wide input. The r bit wide output of the circuit for error detection is led into the third r bit wide input of the subcircuit S5. If an error signal corresponding to a code word of the code C is output by the circuit for error detection S2 12, then a test bit sequence $T_i$ (test vector) is input at the third m bit wide input of the subcircuit S5.

The subcircuit S5 15 is configured such that it outputs at its m bit wide output the value present at its first input if the error signal output by the second subcircuit S2 12 corresponds to a syndrome of a non-code word of the code C, and outputs the value of test bit sequence $T_i$ if the error signal output by the subcircuit corresponds to a syndrome of a code word of the code C.

Expressed in general terms, the test sequence provider 120 can have an error syndrome detector. The error syndrome detector can provide a test trigger signal that triggers the provision of a test bit sequence $T_i$ by the test sequence provider 120 if the error syndrome bit sequence s(v') is identical to a predefined error syndrome bit sequence. In this case, the predefined error syndrome bit sequence indicates that the coded binary word v' is a code word of the error correction code C.

The m bit wide output of the subcircuit S5 15 is led into the m bit wide input of the subcircuit S3 13 to be tested, which outputs a test response signal $R(T_i)$ at its M bit wide output if the signal $T_i$ is present at its input, and outputs the signal R(s(v)) if the syndrome s(v) is present at its input, wherein v is a code word of the code C. The M bit wide output of the circuit S3 13 to be tested is led into an evaluation circuit S4 14, which checks whether test output signals (test response signals) actually output by the subcircuit S3 correspond to expected test output signals (expected test response signals). If lack of correspondence is ascertained, then an error has been detected in the subcircuit S3 to be tested.

If a syndrome of a code word is generated by the subcircuit for forming a syndrome S1 11 and is detected as such by the subcircuit for error detection S2 12, the subcircuit S3 13 can be tested.

By contrast, if a syndrome of a non-code word is generated by the subcircuit for forming a syndrome S1 11 and is detected as such by the subcircuit for error detection S2 12, then the subcircuit S3 13 is not tested and the syndrome present at its inputs is processed by the subcircuit S3.

Figure 4:
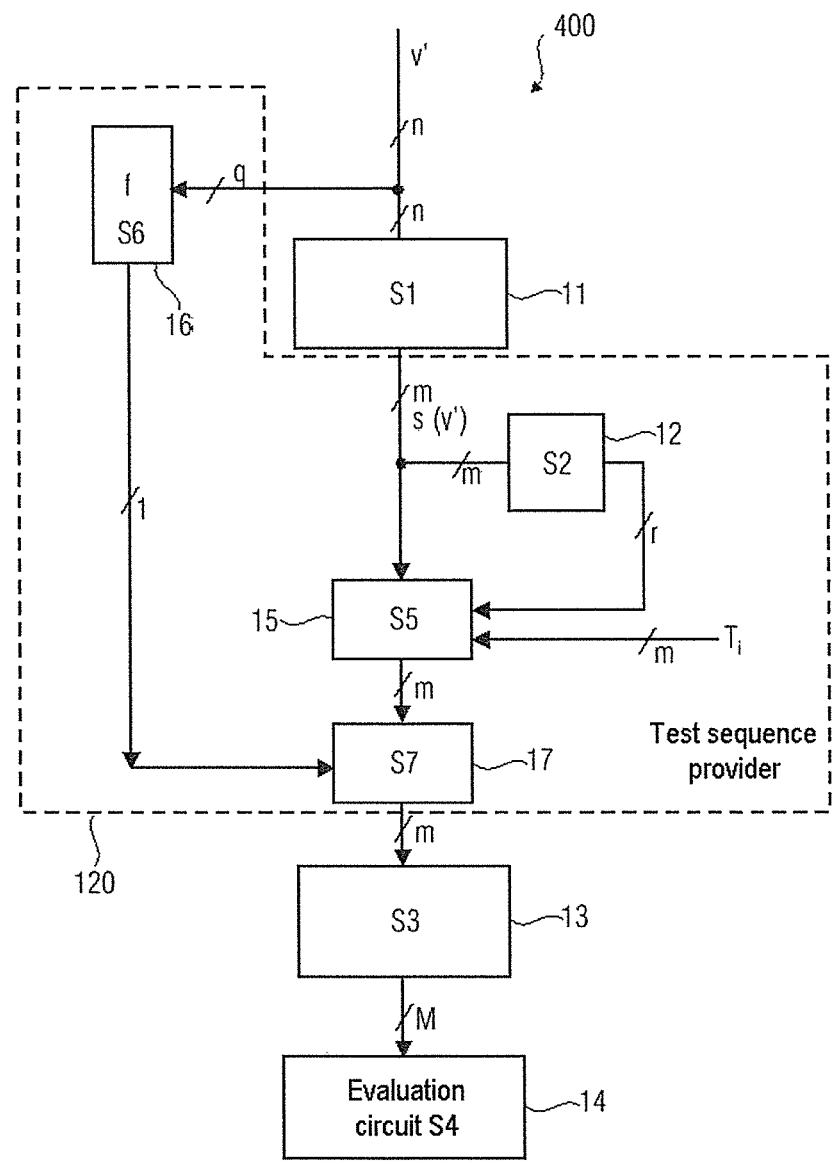
FIG. 4 shows a block diagram of a further device for testing a circuit to be tested.

FIG. 4 shows a circuit arrangement 400 for the case where the matrix K was derived from the parity check matrix H by inversion of q columns of the matrix H component by component, and $K=H_{mod}$ holds true. The columns inverted component by component shall be the columns $h_{i1}, \ldots, h_{iq}$. The circuit sections having the same function as in FIG. 3 are designated by the same symbols and the same numerals, and they will not be described again here. In addition to FIG. 3, a circuit 16 having a q bit wide input and a 1 bit wide output for realizing a linear function $$f(v'_1, \ldots, v'_n) = v_{i1} \oplus \ldots \oplus v_{iq}$$

and a circuit S7 17 having an m bit wide first input and a 1 bit wide second input and an m bit wide output for the controlled inversion of its entries at its first input are present here. The subcircuits S2, S5, S6 and S7 form the test sequence provider and the subcircuits S6 and S7 form a bit sequence inverter that is part of the test sequence provider.

The q bit wide input of the circuit S6 16 for realizing a function f 16 is connected to the q input lines of the circuit S1 11, which carry the values $v_{i1}, \ldots, v_{iq}$, and the 1 bit wide output of the circuit is led into the second, 1 bit wide input of the circuit S7 17. The first, m bit wide input of the circuit S7 17 is connected to the output of the circuit S5 15, while the m bit wide output of the circuit S7 17 is led into the m bit wide input of the circuit S3 13 to be tested. If the value output by the circuit S6 16 for determining the function f is equal to 0, then the circuit S7 17 forwards the value input at its first input directly to its output. If the value output by the circuit S6 16 for determining the function f is equal to 1, then the circuit S7 17 outputs the value inverted component by component of the value present at its first input.

The circuit S2 12 determines whether one of the values $$\underbrace{(0, \ldots, 0)}_{m}$$

or $$\underbrace{(1, \ldots, 1)}_{m}$$

is present.

Figure 5:
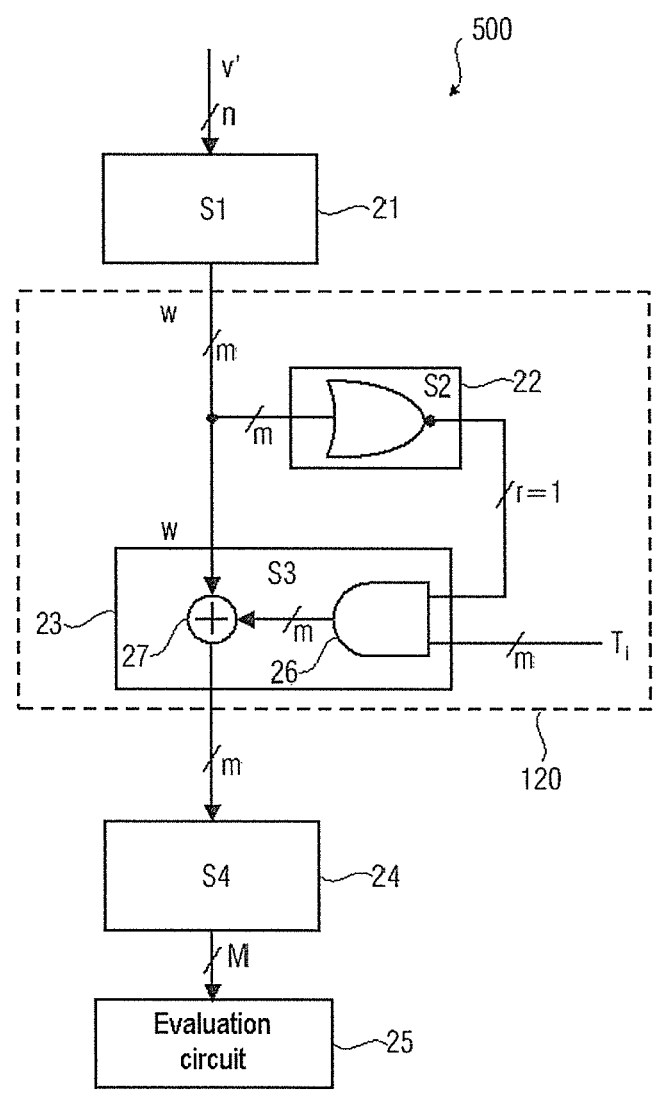
FIG. 5 shows a block diagram of a device for testing a circuit to be tested.

FIG. 5 illustrates a concrete configuration 500 of the circuit illustrated in FIG. 3.

The code C is assumed here to be a linear code of length n having m components of the error syndrome. The first subcircuit S1 21 here is a conventional syndrome generator for forming an m-component syndrome of the linear code C. An n-component coded word v' is present at the n bit wide input of the syndrome generator S1 21. The syndrome generator S1 21 outputs the associated error syndrome s(v')=w at its m bit wide output. If v' is a code word of the code C, then s(v')=0 holds true. If v' is not a code word of the code C, then s(v')≠0. The output of the syndrome generator (syndrome determiner) is simultaneously connected to the m input lines of a NOR gate 22 (error syndrome detector) and to the m first input lines of m XOR gates each having a first and a second input, which are illustrated by the XOR symbol 27. The circuit S2 12 in FIG. 3 is realized here by the NOR gate 22 (Not-OR gate) having m inputs and one output, such that r=1 holds true here. The 1 bit wide output (for providing the test trigger signal) of the NOR gate 22 is led into the first 1 bit wide input of the AND circuit 26. As shown in the example, it may suffice for the test trigger signal to have a width of only exactly one bit.

The AND circuit, which is illustrated here as an AND symbol 26, consists of m AND gates each having a first and a second input and a respective output, to the respective first input of which the 1 bit wide output of the NOR gate 22 is connected and at the respective second input of which the m components of a test bit sequence $T_i$(test inputs) for the circuit S4 24 are input correctly in terms of digit position if s(v')=0 and no error is indicated by the circuit for error detection 22. The m output lines of the AND circuit 26 are connected to the m respective second inputs of the XOR gates 27, the m outputs of which are led into the m inputs of the subcircuit S4 24 to be tested. The circuit S5 15 from FIG. 3 is realized here by the m XOR gates 27 (exclusive-OR gates) and the m AND gates 26. If the test vector $T_i$ is present at the m second inputs of the AND circuit 26 and if s(v')=0, then the test vector $T_i$ is present at the input of the subcircuit S4 24 to be tested, said test vector being processed by this circuit to form a test output signal $R(T_i)'$ and being output to the M bit wide output of the circuit S4 24, this output being led into the input of an evaluation circuit 25. The evaluation circuit 25 serves to ascertain whether the test output signal $R(T_i)'$ corresponds to the expected test output signal or whether the actual test output signal $R(T_i)'$ deviates from the expected test output signal on account of an error in the circuit S4 24 to be tested. If v' is not a code word, then the NOR gate 22 (Not-OR gate) outputs the value 0, such that the m outputs of the m AND gates 26 carry the value 0, which in the XOR gates are subjected to modulo 2 addition with s(v') to form $s(v') \oplus 0 = s(v')$, such that s(v') is present at the m inputs of the subcircuit S4.

Figure 6:
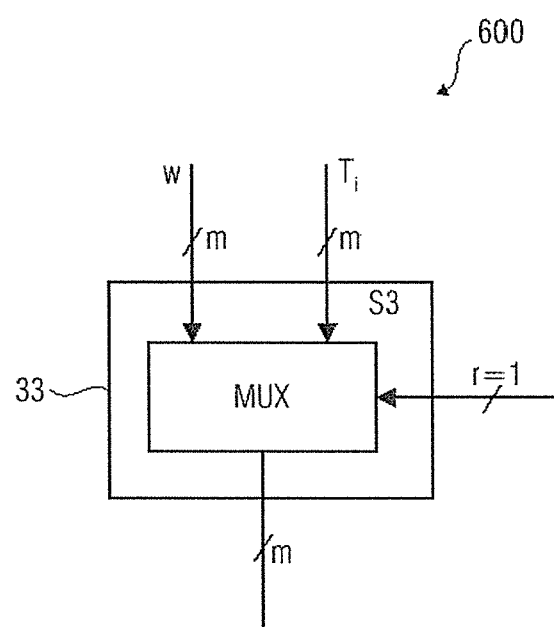
FIG. 6 shows a block diagram of part of a test sequence provider.

FIG. 6 shows a further possible configuration 600 of the subcircuit S5 15 (part of the test sequence provider) from FIG. 3, which is realized here as a multiplexer 33 having m bit wide first data inputs, which carry an m-digit binary value w, having m bit wide second data inputs, at which the m bit wide test vector $T_i$ is present, having m bit wide outputs and having an r=1 bit wide control input. In a manner dependent on the error signal present on the r=1 bit wide control line, wherein the error signal is output by the circuit for error detection S2 (12, 22), the input line of the multiplexer 33 that carries the signal w or the input line of said multiplexer that carries the test vector $T_i$ is connected directly to the output line.

Figure 7:
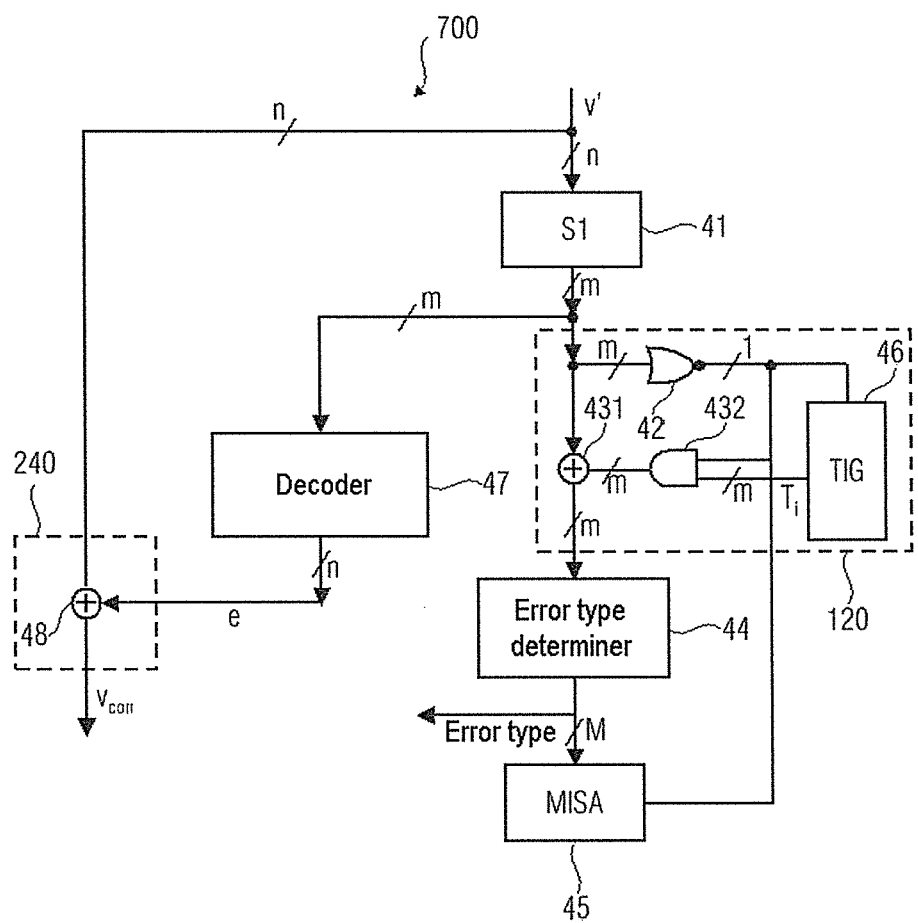
FIG. 7 shows a block diagram of a device for correcting a bit error in a coded binary word with a device for testing a circuit to be tested.

FIG. 7 shows a concrete configuration 700 of the proposed concept where the circuit to be tested is an error type determiner 44 of a circuit arrangement for error correction and error detection. The subcircuit S1 11 from FIG. 3 for forming an error syndrome is designated here as a syndrome generator (syndrome determiner).

The coded values $v' = v'_1, \ldots, v'_n$ of a linear error correcting code C of length n having an m-dimensional error syndrome are present at the n bit wide input of the syndrome generator S1 41. The H-matrix of the code C shall be designated by H. The syndrome s(v') is output at the m bit wide output of the syndrome generator, said syndrome being formed here according to the relationship $$s(v') = H \cdot v'^T$$

The output of the syndrome generator S1 41 is led into the m bit wide input of a decoder 47, which outputs at its n bit wide output the correction bits e1, ..., en, which are combined to form the correction vector $e_1, \ldots, e_n$ (correction signal). The n bit wide output of the decoder 47 is led into the respective first inputs of the n XOR gates 48 (correction unit) each having two inputs and one output, at the respective second inputs of which the coded values $v'_1, \ldots v'_n$ are present and at the outputs of which the values $v_{corr} = v_{1,corr}, \ldots, v_{n,corr} = v \oplus e$ corrected by the code C are output.

The output of the syndrome generator S1 41 is furthermore connected to the input of a NOR gate 42 and to the respective first input of m XOR gates 431. The circuit S2 12 in FIG. 3 is realized here by the NOR gate 42 having m inputs and one output, such that r=1 holds true here. The 1-bit wide output of the NOR gate 42 is led into the first 1 bit wide input of the AND circuit 432. The AND circuit, which is illustrated here as an AND symbol 432, consists of m AND gates each having a first and a second input and a respective output, to the respective first input of which the 1 bit wide output of the NOR gate 42 is connected and at the respective second input of which the m components of a test input $T_i$ for the error type determiner 44 are input correctly in terms of digit position if $s(v')=0$ and the value 1 is output by the NOR gate 42 and thus no error is indicated. The m output lines of the AND circuit 432 are connected to the m second inputs of the XOR gates 431, the m outputs of which are led into the m inputs of the error type determiner 44 S4 to be tested. The circuit S5 15 from FIG. 3 is realized here by the m XOR gates 431 and the m AND gates 432. If the test vector $T_i$ is present at the m second inputs of the AND circuit 26 and if $s(v')=0$, then the test vector $T_i$ is present at the input of the subcircuit error type determiner 44 to be tested, said test vector being processed by this circuit to form a test output signal $R(T_i)$. FIG. 7 illustrates that the test bit sequence $T_i$ is generated by a test input generator TIG 46 having an r=1 bit wide input, which is connected to the output of the NOR gate 42, and having an m bit wide output, which carries the test signal $T_i$ for the circuit error type determiner 44 to be tested. The test input generator TIG can be constructed, for example, from a counter and a ROM (read only memory), wherein, whenever the NOR gate 42 outputs the value 1, i.e. the indication that no error was detectable, the counter is advanced and a new test vector $T_i$ is output by the test input generator.

The test input generator can also be realized as a linear feedback shift register, which undergoes transition to a new state whenever the value 1 is output by the NOR gate 42, wherein the state of said linear feedback shift register can serve as a test input for the error type determiner.

In this example, the test sequence provider 120 is formed by the NOR gate 42, the XOR gate 431, the AND gate 432 and the test input generator 46.

If the NOR gate 42 outputs the value 1 and indicates that no error was detected on the basis of the syndrome, then at the error type determiner 44 a test input $T_i$ is present at its input, which is processed by the error type determiner 44 to form a response value $R(T_i)'$. The M bit wide output of the error type determiner 44 is led into the first, M bit wide input of an evaluation circuit, which in this configuration is realized as a multi-input signature analyzer MISA 45. The error signal generated by the NOR gate 42 is present at the second, r=1 bit wide input of the MISA 45. In the MISA 45, the test output signal values $R(T_i)'$ present at the points in time when the error signal generated by the NOR gate 42 is equal to 1 are accumulated to form a signature. If the signature actually determined corresponds to a signature expected in the error-free case, then no error is detected in the error type determiner. If the signature of the MISA 45 actually determined does not correspond to the expected signature, then an error is detected.

At the points in time when the NOR gate 42 outputs the value 0 and indicates that a syndrome $s(v') \neq 0$ was output by the syndrome former S1 41, the value $s(v')$ of the syndrome is present at the input of the error type determiner 44 and the error type determiner outputs at its M bit wide output a binary value characterizing the error type.

If, by way of example, the code C is a 2-bit error correcting, 3-bit error detecting code, then it is possible for the error type determiner to indicate by a binary signal on three different output lines whether a 1-bit error, a 2-bit error or a 3-bit error has occurred. It is then the case that M=3.

Figure 8:
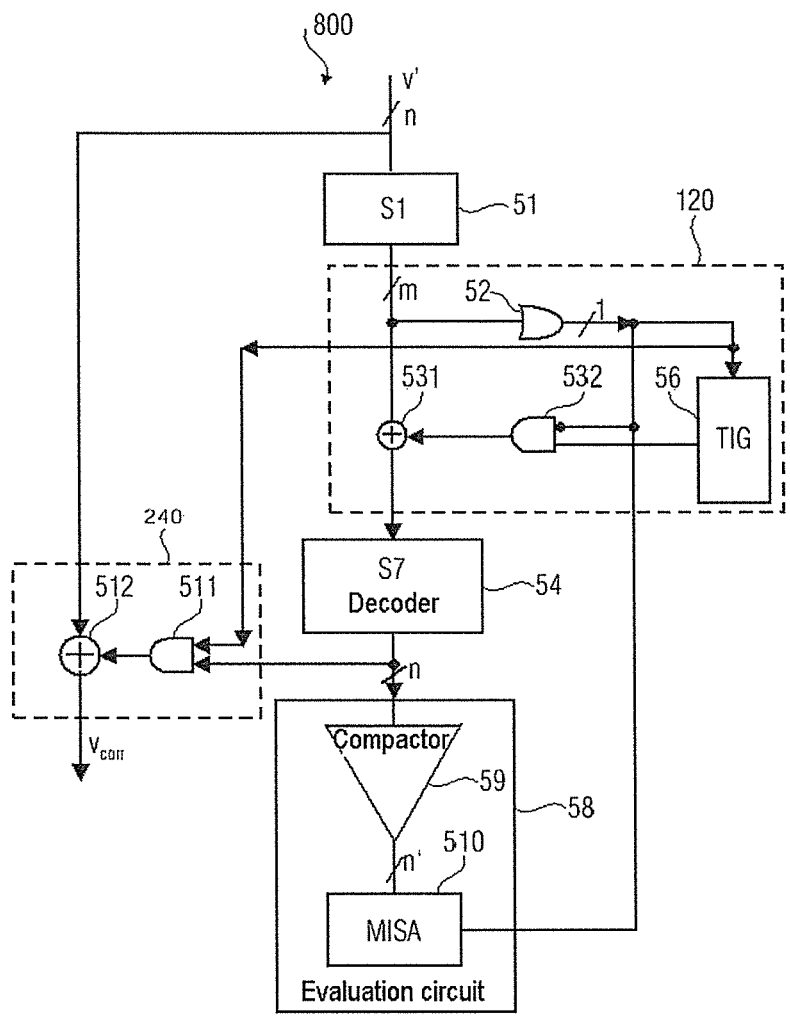
FIG. 8 shows a block diagram of a device for correcting a bit error in a coded binary word with a device for testing a circuit to be tested.

FIG. 8 shows a further concrete configuration 800 where the circuit to be tested is a decoder S4 57 of a circuit arrangement for error correction. The subcircuit S1 11 from FIG. 3 for forming an error syndrome is again designated here as a syndrome generator.

The coded values $v'=v'_1, \ldots, v'_n$ of a linear error correcting code C of length n having an m-dimensional error syndrome are present at the n bit wide input of a syndrome generator S1 51. The H-matrix of the code C shall again be designated by H. The syndrome $s(v')$ is output at the m bit wide output of the syndrome generator, said syndrome being formed here according to the relationship $$s(v')=H \cdot v'^T$$

The output of the syndrome generator S1 51 is connected to the m-digit input of an OR gate having an output 52 and to the respective first input of m XOR gates 531 each having a first and a second input. The circuit S2 12 for error detection in FIG. 3 is realized here by the OR gate 52 having m inputs and one output, such that r=1 holds true here. The 1 bit wide output of the OR gate 52 is negated and led into the first 1 bit wide input of the AND circuit 532. The AND circuit 532, which is illustrated here as an AND symbol 532, consists of m AND gates each having a first and a second input and a respective output, to the respective first input of which the 1 bit wide negated output of the OR gate 52 is connected and at the respective second input of which the m components of a test input $T_i$ for the decoder 57 are input correctly in terms of digit position if $s(v')=0$ and the value 0 is output by the OR gate 52 and thus no error is indicated.

The m output lines of the AND circuit 532 are connected to the m second inputs of the XOR gates 531, the m outputs of which are led into the m inputs of the decoder 57 to be tested. The circuit S5 15 from FIG. 3 is realized here by the m XOR gates 531 and the m AND gates 532. If the test vector $T_i$ is present at the m second inputs of the AND circuit 532 and if $s(v')=0$, then the test vector $T_i$ is present at the input of the decoder 57 to be tested, said test vector being processed by the decoder to form a test output signal $R(T_i)'$. FIG. 8 also illustrates that the test input $T_i$ is generated by a test input generator TIG 56 having an r=1 bit wide input, which is connected to the output of the OR gate 52, and having an m bit wide output, which carries the test signal $T_i$ for the circuit decoder 57 to be tested. The test input generator TIG can be constructed, for example, from a counter and a ROM, wherein, whenever the OR gate 52 outputs the value 0, i.e. the indication that no error was detectable, the counter is advanced and a new test vector $T_i$ is output by the test input generator.

The test input generator can, for example, also be realized as a linear feedback shift register, which undergoes transition to a new state whenever the value 0 is output by the OR gate 52, wherein the state of the linear feedback shift register can serve as a test input for the error type determiner.

The M=n bit wide output of the decoder 57 is led into the first, n bit wide input of an evaluation circuit 58, which in this configuration is realized as a compactor 59 with multi-input signature analyzer MISA 510 connected downstream. The error signal generated by the OR gate 52 is present at the second, r=1 bit wide input of the MISA 510. In the MISA 510, the test response values $comp[R(T_i)']$ present at the points in time when the error signal generated by the OR gate 52 is equal to zero, i.e. the test response values compacted by the compactor 59, are accumulated to form a signature. If the signature actually determined corresponds to a signature expected in the error-free case, then no error is detected in the decoder. If the signature of the MISA 45 actually determined does not correspond to the expected signature, then an error is detected.

At the points in time when the OR gate 52 outputs the value 1 and indicates that a syndrome $s(v') \neq 0$ was output by the syndrome generator S1 51, the value $s(v')$ of the syndrome is present at the input of the decoder 57 and the decoder outputs at its n bit wide output an n-digit binary correction value which is in the bits 1 which are corrected by the code C.

If, by way of example, the code C is a 2-bit error correcting code, then it is possible for a single bit or two bits to be corrected. The n-digit coded value v' is also present at the respective n first inputs of the n XOR gates 512 each having two inputs and one output. The n-digit correction value output by the decoder 57 is also present at the respective first input of the n AND gates 511 each having two inputs and one output, the respective second input of which is connected to the output of the OR gate 52. The n outputs of the n AND gates are connected to the respective n second inputs of the n XOR gates 511, at the n bit wide outputs of which the corrected value $v_{corr}$ is output.

If $s=0$, and if no error is thus detected at the error syndrome, then the OR gate 52 outputs the value 0 and the value 0 is in each case present at the second inputs of the n XOR gates 512, such that v' is output unchanged as $v_{corr}=v'$. On the other hand, if $s \neq 0$, then the OR gate 52 outputs the value 1. The m bit wide syndrome $s(v')$ is then present at the m inputs of the decoder 57 since the AND gates 532 output the m-digit value 0, such that the m XOR gates 531 output at their outputs the error syndrome $s(v')$ present at the inputs of the decoder 57. The decoder 57 outputs at its n outputs the corresponding correction values combined via the n AND gates 511 in the n XOR gates 512 to form the corrected value $v_{corr}$. If the errors in v' can be corrected by the chosen code C, then $v_{corr}$ is error-free.

The evaluation circuit 58 in the specific configuration comprises a compactor 59 and a multi-input signature analyzer MISA 510 connected downstream. The compactor 59 maps an n bit wide input value onto an only n' bit wide output value, wherein n'<n holds true. In the simplest case, the compactor 59 can be a parity tree having n inputs and one output. In this case, n'=1. Likewise, n', where n'>1, parity trees can also be realized. It is also possible for the compactor 59 to have storage elements. If the output value of the OR gate 52 is equal to 0, then in the MISA the response values $R(T_i)$ output by the decoder 57 and values compacted by the compactor 59 are accumulated in the MISA. If the syndrome $s(v') \neq 0$ and if an error is thus detected, then in the MISA no value present at its inputs is accumulated.

The test sequence provider 120 is formed by the OR gate 52, the XOR gate 531, the AND gate 532 and the test input generator 56, the evaluation circuit 58 is formed by the compactor 59 and the multi-input signature analyzer 510 and the correction unit is formed by the AND gate 511 and the XOR gate 512.

Figure 9:
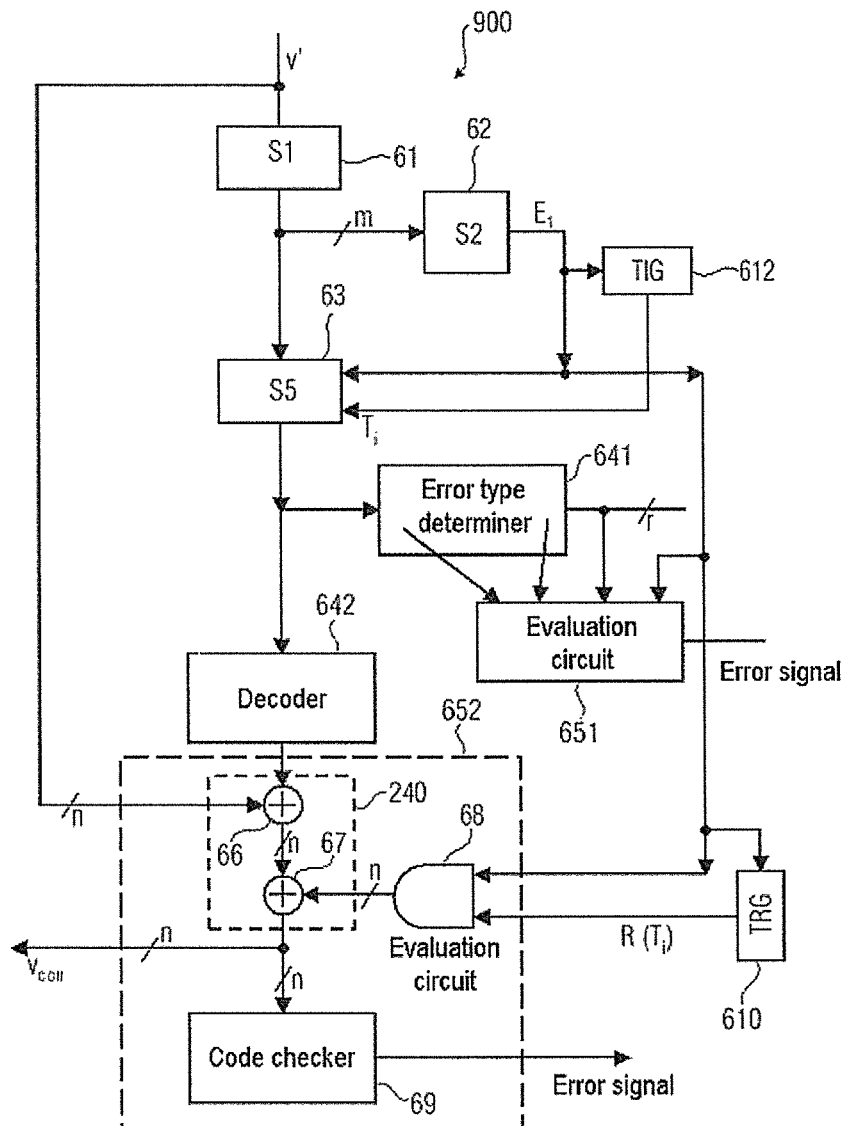
FIG. 9 shows a block diagram of a device for correcting a bit error in a coded binary word with a device for testing a circuit to be tested.

FIG. 9 illustrates a further circuit arrangement 900 according to the proposed concept.

The coded values $v'=v'_1, \ldots, v'_n$ of a linear error correcting code C of length n having an m-dimensional error syndrome are present at the n bit wide input of a syndrome generator S1 61. The H-matrix of the code C shall again be designated by H. The syndrome $s(v')$ is output at the m bit wide output of the syndrome generator 61, said syndrome being formed here according to the relationship $$s(v')=H \cdot v'^T$$

If v' is a code word, then the syndrome is equal to 0; by contrast, if v' is not a code word, the syndrome is not equal to 0, wherein 0 denotes $$\underbrace{(0, \ldots, 0)}_{m}.$$

The output of the syndrome generator S1 61 is led into the m bit wide input of the circuit for error detection S2 62 and simultaneously into the m bit wide first input of the subcircuit S5 63. The circuit for error detection S2 62 outputs different error signals at its r=1 bit wide output if a syndrome of a code word of the code C or a syndrome of a non-code word of the code C is present at its m bit wide input. The r=1 bit wide output of the circuit for error detection is led into the third, r bit wide input of the subcircuit S5 and into the input of a circuit for generating test inputs TIG 612. The circuit for generating test inputs generates a test input Ti whenever the circuit for error detection outputs a value corresponding to a syndrome of a code word of the code C. The output—carrying the value $T_i$—of the circuit TIG 612 is connected to the second m bit wide input of the subcircuit S5 63. If an error signal corresponding to a code word of the code C is output by the circuit for error detection S2 12, then a test vector Ti is input at the third m bit wide input of the subcircuit S5 63.

The subcircuit S5 63 is configured such that it outputs at its m bit wide output the value present at its first input if the error signal output by the second subcircuit S2 62 corresponds to a syndrome of a non-code word of the code C, and outputs the value $T_i$ if the error signal output by the subcircuit corresponds to a syndrome of a code word of the code C.

The test sequence provider is formed by the subcircuit S2, the subcircuit S5 and the test input generator TIG 612.

The output of the subcircuit S5 63 is simultaneously led into the input of a decoder 642 and into the input of an error type determiner 641. The n bit wide output of the decoder 642 is led into the respective first inputs of n XOR gates 66 each having two inputs and one output, at the respective second inputs of which the coded values $v'_1, \ldots, v'_n$ are present, which are also present at the input of the syndrome generator S1 61. If $v'=v'_1, \ldots, v'_m$ is a code word, then the syndrome generated by the syndrome generator S1 61 is $s(v')=0$ and the output of the subcircuit S5 63 is connected to its second input, carrying the test input $T_i$, such that the test input $T_i$ is present at the input of the decoder 642. The corresponding test output signal $R'(T_i)$ is output by the decoder 642 and subjected to modulo 2 addition in the XOR gates 66 to form $v' \oplus R(T_i)'$ and is output at the n outputs of said n XOR gates.

The outputs are led into the respective n first inputs of further n XOR gates 67 each having two inputs and one output, to the respective second inputs of which the outputs of n AND gates 68 each having two inputs and one output are connected. The error signal $E_1$ output by the error detection circuit S2 62 is present at the respective first input of said AND gates 68, said error signal, since a code word is present, being equal to 1. The respective second inputs of said AND gates are connected to the input of a test response generator TRG 610, the input of which is likewise connected to the output—carrying the error signal $E_1$—of the error detection circuit S2 62. If $E_1=1$, then the error-free test output signal R(T$_i$) output by decoder 642 when the test input T$_i$ is input is output by the test response generator TIG 610, said signal being XORed in the XOR gates 67 with v'⊕R(T$_i$)' to form $$v_{corr} = v' \oplus R(T_i)' \oplus R(T_i)$$

and being provided on the n output lines of said n XOR gates 66.

The n-digit output of the n XOR gates is led into the input of a code checker 69 and connected directly to the circuit output carrying the value v$_{corr}$. The code checker 69 checks whether v$_{corr}$ is a code word of the code C. If R(T$_i$)=R(T$_i$)' holds true, then v$_{corr}$=v'. The code checker can be realized, for example, as a syndrome generator of the code C having n inputs and m outputs, which outputs the error syndrome s(v$_{corr}$) at its m outputs and downstream of which a logical OR combination of its output lines is connected. However, it is also possible for only a few components of the error syndrome to be realized by the code checker. Since the design of code checkers is known to the person skilled in the art and the specific form of the code checker is also not the subject matter of the patent claims, that will not be explained any further here.

If v$_{corr}$ is not a valid code word, then R(T$_i$)≠R(T$_i$)' and, when the test input T$_i$ is input, an error is detected in the decoder.

The evaluation circuit 14 from FIG. 3 is realized here as circuit 652 consisting of the circuit components 66, 67, 68 and 69. In this case, the correction unit 240 is formed by the circuit components 66, 67 and is part of the evaluation circuit.

Expressed in general terms, the correction unit can generate a processed test output signal on the basis of a logical XORing of the correction signal with the coded binary word v' and provide said test output signal to the evaluation unit. Generally, a logical XORing can be realized by an XOR logic gate.

Expressed in general words, the evaluation unit can have a code checker. In addition, the correction unit can generate the processed test output signal on the basis of a logical XORing of an expected reference test signal R(T$_i$) with the result of the logical XORing of the correction signal e with the coded binary word v' if the error syndrome bit sequence s(v') indicates that the coded binary word v' is a code word of the error correction code C. The code checker then generates an error signal indicating whether the processed test output signal is a code word of the error correction code C.

The output of the subcircuit S5 is furthermore led into the input of an error type determiner 641, which, at its r bit wide output, using the values of the error syndrome s(v'), indicates what type of error is present. The r bit wide output of said error type determiner 641 is led into a first, r bit wide input of a first evaluation circuit 651, at the second, here 1 bit wide input of which the error signal E1 is input, which is output by the subcircuit for error detection S2 62. Furthermore, it is possible for additional outputs of the error type determiner 641, which serve for instance for improving the testability of the error type determiner 641, to be used, which are likewise led into additional inputs of the evaluation circuit. The evaluation circuit 652 can be a multi-input signature analyzer MISA, for example, which accumulates the test output signal values (test response values) generated by the error type determiner whenever the subcircuit S2 for error detection indicates that the syndrome of a code word is present at its input.

Only one test input generator TIG 612 is depicted in FIG. 9. It is likewise possible to use two or more test input generators, wherein the first test input generator generates test inputs for the error type deteterminer 641 and the second test input generator generates test inputs for the decoder 642.

Figure 10:
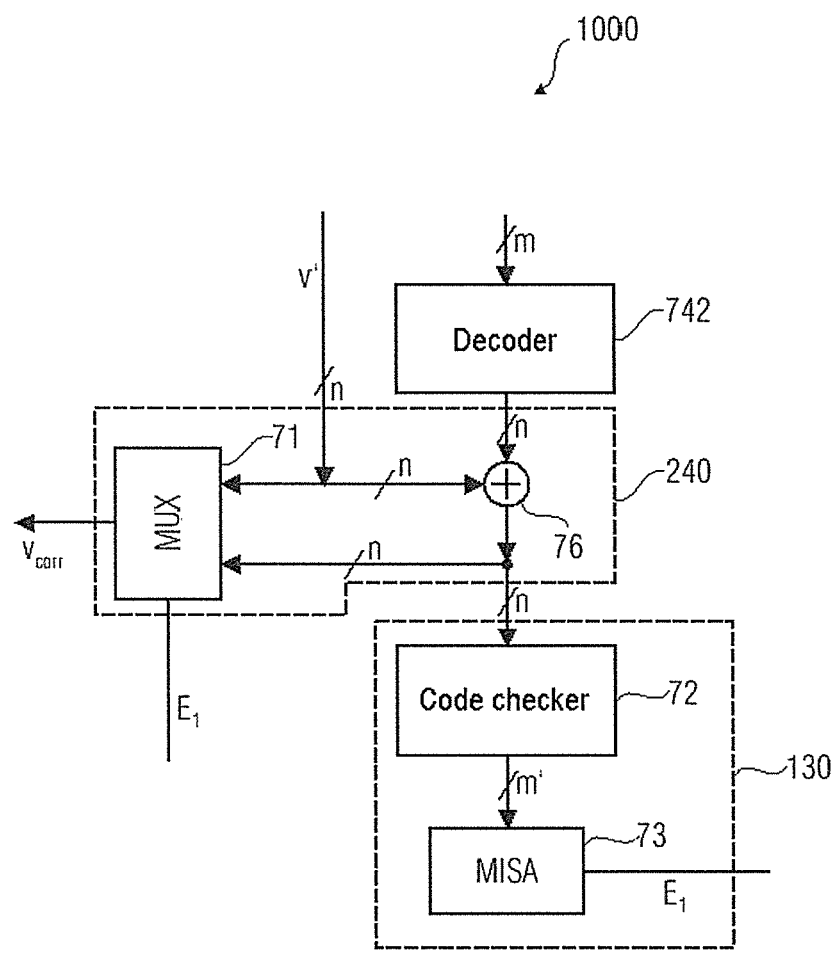
FIG. 10 shows a block diagram of a device for correcting a bit error in a coded binary word with a device for testing a circuit to be tested.

FIG. 10 shows a further possible realization 1000 of the evaluation circuit 14 from FIG. 3, which can replace the evaluation circuit 652 from FIG. 9, for example. The output of the decoder 742 is led into the respective first inputs of n XOR gates 76 each having two inputs and one output, the respective second inputs of which are connected to the n lines which carry the coded values n and which are simultaneously connected to the n first inputs of a multiplexer MUX 71. The n bit wide output of the n XOR gates 76 is simultaneously led into the n bit wide input of a code checker 72 and into the second n inputs of the multiplexer MUX 71, which outputs the value v$_{corr}$ at its output and at whose control input is present the error signal E1 output at the output of the circuit for error detection S2 62 in FIG. 9.

In the example, the evaluation circuit 130 comprises the code checker 72 and the MISA 73 and the correction unit 240 comprises the XOR gate 76 and the multiplexer 71.

If v' is a code word of the code C considered, then the error signal E$_1$ in FIG. 9 is equal to 0 and the test input signal T$_i$ is input into the decoder 742. The decoder 742 outputs the test response signal R(T$_i$)'. The value v'⊕R(T$_i$)' input into the code checker 72 is present at the output of the XOR gates 76. The multiplexer MUX 71 connects its first input to its output, at which the value v$_{corr}$=v' is present. The code checker is embodied, for example, as a syndrome generator of the linear code C. It then outputs at its m bit wide output the value $$\text{Codech}(v' \oplus R(T_i)') = \text{Codech}(v') \oplus \text{Codech}(R(T_i)') = \text{Co-dech}(R(T_i)')$$

which is dependent only on R(T$_i$)' and which, in the clock cycles in which E$_1$ is equal to 0, is accumulated in the MISA 73 to form a signature.

If v' is not a code word of the code C considered, then the error signal E$_1$ is equal to 1. The value v' is then present at the input of the decoder 742. The decoder then outputs correction values which are combined to form an n-digit correction vector e=e$_1$, . . . , e$_n$. The correction vector e is logically combined in the XOR gates 76 with v' to form v'⊕e=v$_{corr}$. Since the error signal E1 is equal to 1, the second input of the multiplexer MUX 71 is linked to its output, on which v$_{corr}$=v'⊕e is now output. The value codech(v'⊕e) output by the code checker 72 is ignored in the MISA and not accumulated, since E$_1$=1.

Figure 11:
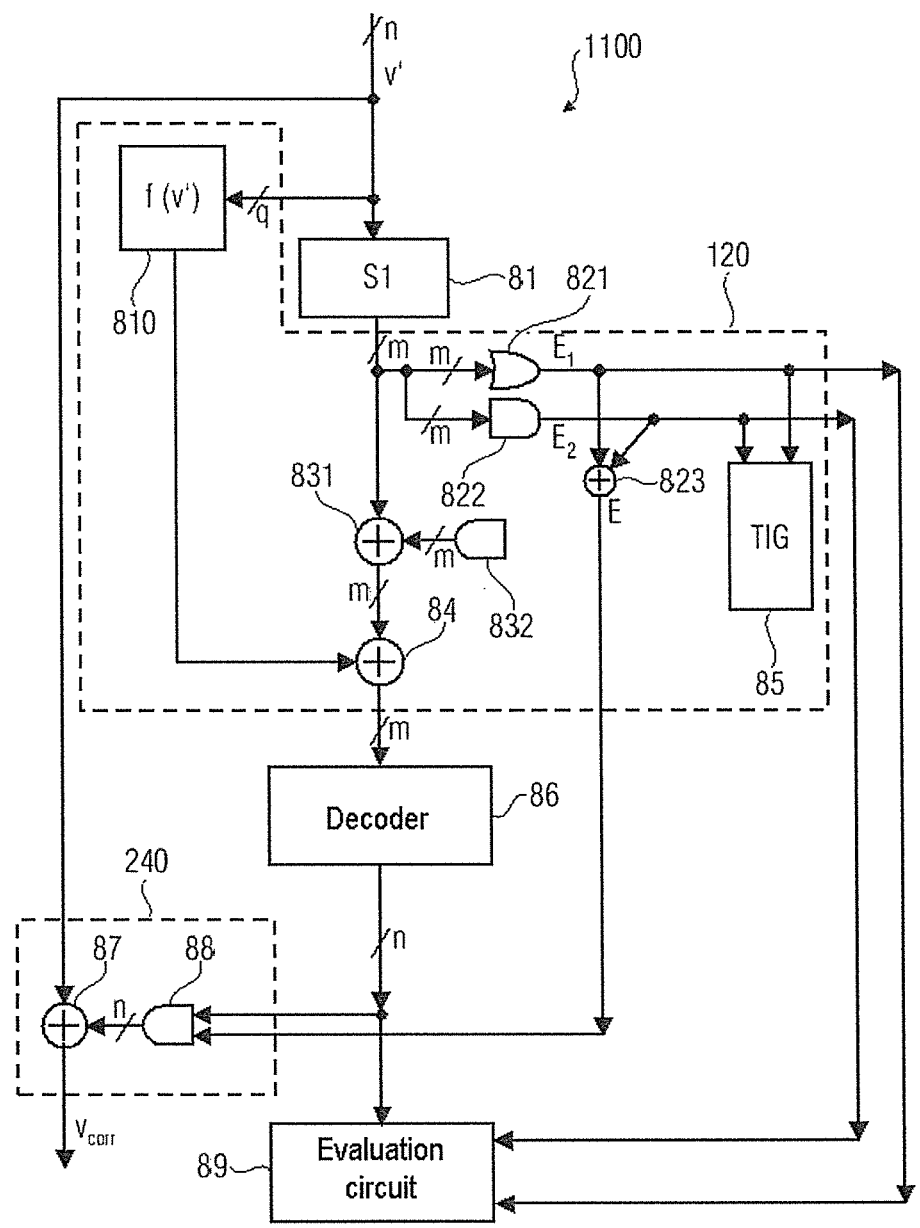
FIG. 11 shows a block diagram of a device for correcting a bit error in a coded binary word with a device for testing a circuit to be tested and FIG. 12 shows a flowchart of a method for testing a circuit to be tested.

FIG. 11 shows a further configuration of a circuit arrangement, wherein the matrix K=H$_{mod}$ is derived from the parity check matrix H=(h1, . . . , h$_n$) by inversion of q columns h$_{i1}$, . . . , h$_{iq}$ component by component. The subcircuit f 810 realizes the function $$f(v'_1, \ldots, v'_n) = v'_{i1} \oplus \ldots \oplus v'_{iq}$$

the q inputs of which are connected to the q inputs of the syndrome former S1 81, which carry the components v$_{i1}$, . . . , v$_{iq}$. The m-component output of the syndrome former S1 81 is simultaneously connected to the m inputs of an OR gate 821 having m inputs and one output, an AND gate 822 having m inputs and one output and the m respective first inputs of m XOR gates 831 each having two inputs and one output. The outputs—carrying the binary value E$_1$ and E$_2$—of the OR gate 821 and of the AND gate 822 are led both into the first and second inputs of an XOR gate 823 and into the first and second inputs of a test input generator TIG 85 and also into the first two inputs of an evaluation circuit 89.

The output of the test input generator TIG 85 is connected to the respective first inputs of m AND gates 832 each having two inputs and one output, to the respective second inputs of which the negated output of the XOR gate 823 is connected, which output is simultaneously connected, without being negated, to the respective first input of n AND gates 88 each having two inputs and one output. The respective second inputs of the XOR gates 831 are connected to the outputs of the AND gates 832. The m outputs of the m XOR gates 831 are led into the respective m first inputs of the m XOR gates 84 each having two inputs and one output, the respective second inputs of which are connected to the output of the circuit for forming the function f 810. The m outputs of the m XOR gates 84 are connected to the m inputs of a decoder 86, which provides the n-component correction value at its n outputs, wherein the n outputs of the decoder 86 are simultaneously connected to the n third inputs of the evaluation circuit 89. The n outputs of the n AND gates 88 are led into the n respective first inputs of the n XOR gates 87, to the n first inputs of which input lines carrying the values $v'=v'_1, \ldots, v'_n$ are connected, and the output lines of which output the corrected value $v_{corr}$.

In this example, the correction unit 240 comprises the AND gate 88 and the XOR gate 87, and the test sequence provider 120 comprises the circuit for forming the function f 810, the XOR gate 84, the OR gate 821, the AND gate 822, the XOR gate 831, the XOR gate 823, the AND gate 832 and the test input generator 85, wherein the circuit for forming the function f 810 and the XOR gate 84 form a bit sequence inverter of the test sequence provider 120.

In order to provide a better understanding, the functioning of the circuit arrangement from FIG. 11 will now be described.

If v' is a code word, then the syndrome generator S1 81 outputs the value $$\underbrace{(1, \ldots, 1)}_{m}$$

if $f(v')=0$, and the value $$\underbrace{(0, \ldots, 0)}_{m}$$

if $f(v')=1$. We will firstly consider the case $f(v')=0$. It holds true that $E_1=E_2=0$, $E=0$ and the test input generator TIG outputs a value $T_i$, which, guided via the AND gates 832, the XOR gates 831 and 84, is present at the input of the decoder 86. Since the output—carrying the error signal E—of the XOR gate 823 is equal to 0, $v_{corr}=v'$ holds true. The decoder outputs the value $R(T_i)'$, which is accumulated in the evaluation circuit 89.

Let it now be the case the $f(v')=1$. The syndrome generator S1 81 now outputs the value $$\underbrace{(1, \ldots, 1)}_{m},$$

which is present at the m inputs of the OR gate 821 and at the m inputs of the AND gate 822, such that these two gates output the values $E_1=E_2=1$, which are logically combined in the XOR gate 823 to form 0, such that the value $T_i$ is in each case present at the m outputs of the m AND gates 832 and is logically combined in the m XOR gates 831 to form $(1, \ldots, 1) \oplus T_i$ and in the XOR gates 84 to form $(1, \ldots, 1) \oplus T_i \oplus$ $(1, \ldots, 1) = T_i$, such that the test input $T_i$ is input into the input of the decoder 86, which outputs at its output the test response value $R(T_i)'$, which is input into the evaluation circuit 89 for evaluation. Since the value output by the XOR gate is E=0, the value $$\underbrace{(0, \ldots, 0)}_{n}$$

is output by the outputs of the AND gates 88, and $v'=v_{corr}$ holds true.

If v' is now not a code word, then the syndrome $s(v')$ generated by the syndrome generator S1 81 is not equal to $$\underbrace{(1, \ldots, 1)}_{m}$$

and likewise not equal to $$\underbrace{(1, \ldots, 1)}_{m}.$$

It thus holds true that $E_1 \neq E_2$ and thus E=1. The syndrome $s(v')$ is output unchanged by the XOR gates 831 and inverted in the XOR gates 84 when $f(v')=1$, such that the syndrome is now present at the decoder as if it had been determined by the parity check matrix H of the code C according to the relationship $$s(v')^T = H \cdot v'^T$$

In the decoder 86, the bits to be corrected are determined, which can be combined to form the correction vector e, which are output by the AND gates 88 owing to E=1 and are subjected to modulo 2 addition in the XOR gates 87 to form $v' \oplus e = v_{corr}$. In the evaluation circuit 89, the values output by the decoder 86 are not evaluated since $E_1 \neq E_2$ holds true.

In principle, it is possible to interchange the order of the XOR gates 831 and 84. The order indicated in FIG. 11 has the advantage that the values which are input into the inputs of the XOR gates 831 and 84 are not constant even when exclusively code words v' are input into the circuit inputs. Likewise, the values of the error syndromes which are generated by the syndrome generator S1 are not constant when exclusively code words are input, which is advantageous since stuck-at errors of the corresponding inputs and outputs of the corresponding gates in the course of operation can be detected.

Some embodiments relate to a device for testing a circuit to be tested comprising a means for determining an error syndrome bit sequence, a means for providing a test sequence and a means for detecting an erroneous processing. The means for determining an error syndrome bit sequence determines an error syndrome bit sequence $s(v')$ on the basis of a coded binary word v'. In this case, the error syndrome bit sequence $s(v')$ indicates whether the coded binary word v' is a code word of an error correction code C used for coding the coded binary word v'. Furthermore, the means for providing a test bit sequence provides at least once a test bit sequence $T_i$ of the circuit to be tested, said test bit sequence being different than the error syndrome bit sequence $s(v')$, if the error syndrome bit sequence $s(v')$ indicates that the coded binary word is a code word of the error correction code C. Furthermore, the means for detecting an erroneous processing detects an erroneous processing of the test bit sequence $T_i$ by the circuit to be tested, on the basis of a test output signal $R(T_i)'$, caused by the test bit sequence $T_i$, of the circuit to be tested.

In addition, the device can comprise further optional units which realize one or more of the above-described aspects of the proposed concept.

Figure 12:
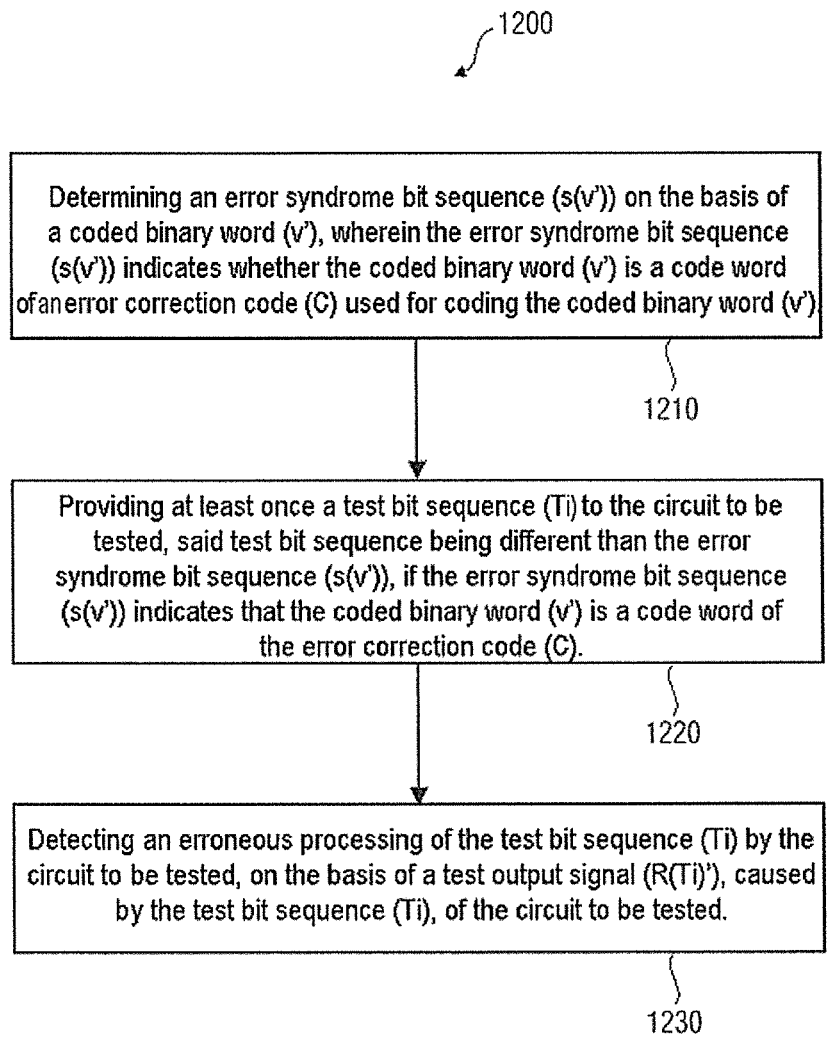

FIG. 12 shows a flowchart of a method 1200 for testing a circuit to be tested in accordance with one example embodiment. The method 1200 comprises determining 1210 an error syndrome bit sequence s(v') based on a coded binary word v'. In this case, the error syndrome bit sequence s(v') indicates whether the coded binary word v' is a code word of an error correction code C used for coding the coded binary word v'. Furthermore, the method 1200 comprises providing 1220 at least once a test bit sequence $T_i$ to the circuit to be tested, wherein the test bit sequence is different than the error syndrome bit sequence v', if the error syndrome bit sequence v' indicates that the coded binary word v' is a code word of the error correction code C. Furthermore, the method 1200 comprises detecting 1230 an erroneous processing of the test bit sequence $T_i$ by the circuit to be tested, based on a test output signal $R(T_i)'$, caused by the test bit sequence $T_i$, of the circuit to be tested.

In addition, the method 1200 can comprise further optional steps that realize one or more of the above-described aspects of the proposed concept.

Some embodiments relate to a circuit arrangement that allows the test to be carried out in the course of operation (online test).

By way of example, a circuit arrangement for processing data coded using a code C comprises a first subcircuit S1 11 having n binary inputs and m binary outputs where m n for forming a syndrome having a width of m bits, at the n binary inputs of which the coded n bit wide data $v'=v'_1, \ldots, v'_n$ to be processed are present and at the m binary outputs of which m components $s_1(v'), \ldots, s_m(v')=s(v')$ of a syndrome s(v') are output. The syndrome s(v') is determined from the coded data v' according to the relationship $$s(v')^T = K \cdot v'^T$$

and K is a binary (m, n) matrix corresponding to the code C.

Furthermore, a second subcircuit S2 12 for error detection having m binary inputs and r, 1≤r, outputs is present, wherein the m outputs carrying syndrome components of the first subcircuit are connected to the m inputs of the second subcircuit. The second subcircuit outputs different values when s(v') is input if v' is not a code word of the code C and if v' is a code word of the code C.

Furthermore, a third subcircuit S3 13 to be tested having m, m'≥1 binary inputs and M, M≥1 binary outputs is present, at the m' binary inputs of which a test input $T_i$ is present at points in time $t_i$ when the second subcircuit outputs values which indicate that a syndrome s(v') of a code word v' of the code C was input at its inputs. Said third subcircuit outputs on its M outputs a test response value $R(T_i)'$, which is dependent on the test input $T_i$ present and on an error possibly present, on its M outputs.

In accordance with one aspect, an evaluation circuit S4 14 for evaluating test responses is present, by which evaluation circuit test output signals $R(T_i)$, which are output by the third subcircuit S3 13 at points in time $t_i$ when the second subcircuit S2=F 12 for error detection outputs values indicating that a syndrome s(v') of a code word v' of the code C is present at the inputs of the second subcircuit, are related to expected correct test responses.

Furthermore, the matrix K can be identical to the parity check matrix $H=(h_1, \ldots, h_n)$ of the code C.

Alternatively, the matrix K can be a binary (m, n) matrix which is determined by component-by-component inversion of q columns $h_{i1}, \ldots, h_{iq}$ of the parity check matrix $H=(h_1, \ldots, h_n)$ of the code C, and 1≤q≤n holds true.

In this case, it is possible that e.g. q=1.

In accordance with a further aspect, a fifth subcircuit S5 15 having m first binary inputs, m second binary inputs, r third binary inputs and m binary outputs is present, wherein the m binary outputs of the first subcircuit S1 11, which carry the syndrome s(v'), are connected to the first m binary inputs of the fifth subcircuit S5 15. An m-digit test vector $T_i$ is present at the second m binary inputs of the fifth subcircuit at a point in time $t_i$ and the r binary outputs of the second subcircuit S2 12 are connected to the third r binary inputs. The fifth subcircuit S5 15 is configured such that the syndrome s(v') is output at its m binary outputs if the second subcircuit S2 12 outputs a value that does not correspond to a code word, and such that the value $T_i$ is output if the second subcircuit outputs a value that corresponds to a code word of the code C.

Furthermore, the m binary inputs of the third subcircuit S3 13 to be tested are connected to the m binary outputs of the subcircuit S5 15 and the M binary outputs of the subcircuit S3 13 are led into M binary inputs of the subcircuit S4 14, by which test response values $R(T_i)'$, which are output by the third subcircuit S3 13 to be tested at points in time $t_i$ if the second subcircuit outputs a value that corresponds to a code word, are related to expected error-free test output signals.

Furthermore, a further subcircuit S6 16 having q binary inputs and one binary output for realizing a function $$f(v'_1, \ldots, v'_n) = v'_{i1} \oplus \ldots \oplus v'_{iq}$$

can be present, the q inputs of which are connected to the input lines of the subcircuit S1 carrying the values $v'_{i1}, \ldots, v'_{iq}$ and the 1 bit wide output of which is led into the first, 1 bit wide input of a seventh subcircuit S7 17, the second, m bit wide input of which is connected to the output of the fifth subcircuit S5 and the subcircuit S7 is configured such that, at the m bit wide output of the seventh subcircuit S7 17, the values present at its second input are output unchanged if $f(v_1, \ldots, v_n)=0$, and the values negated component by component of the values present at its inputs are output if $f(v_1, \ldots, v_n)=1$.

Furthermore, the m binary inputs of the subcircuit S3 13 to be tested are connected to the m outputs of the seventh subcircuit S7 17, such that the value $T_i$ is present at the inputs of the subcircuit S3 if the second subcircuit outputs a value that corresponds to a code word, and the third subcircuit S3 13 outputs a test output signal value $R(T_i)'$, which is dependent on the test input $T_i$ and on errors possibly present in it, on its M outputs, which are led into M inputs of an evaluation circuit S4 14 for evaluating test response values, in which the current test response values are compared with error-free test response values expected at corresponding points in time.

In addition, it may be the case that q=1, $f(v, \ldots, v'_n)=v'_i$ where 1≤i≤n and the function $f(v'_1, \ldots, v'_n)$ can be realized by a 1 bit wide line carrying the value $v'_i$.

The subcircuit to be tested can be an error type determiner 44 of a code.

Alternatively, the subcircuit to be tested can be a decoder of a circuit arrangement for error correction using a code C.

In addition, a further circuit to be tested can be present, which is an error type determiner 641 of the error correcting code.

In accordance with one aspect, a test input generator 46 can be present, which outputs a test signal $T_i$ at points in time $t_i$ when the circuit for error detection indicates no error.

The test input generator can contain a ROM and a counter.

Alternatively, the test input generator can contain a linear feedback shift register.

Furthermore, the evaluation circuit of the test output signal values can contain a multi-input signature analyzer.

Furthermore, the evaluation circuit 14 of the test output signal values can contain a code checker 69, 76 of the code C.

Furthermore, it may be the case that m'=m.

Optionally, additional outputs of the circuit to be tested, which serve for improving the testability of the circuit to be tested, can be evaluated in the evaluation circuit.

Although some aspects have been described in connection with a device, it goes without saying that these aspects also constitute a description of the corresponding method, such that a block or a component of a device should also be understood as a corresponding method step or as a feature of a method step. Analogously to that, aspects described in connection with a or as a method step also constitute a description of a corresponding block or detail or feature of a corresponding device.

Depending on specific implementation requirements, exemplary embodiments of the invention can be implemented in hardware or in software. The implementation can be carried out using a digital storage medium, for example a floppy disk, a DVD, a Blu-Ray disk, a CD, a ROM, a PROM, an EPROM, an EEPROM or a FLASH memory, a hard disk, or some other magnetic or optical storage device, on which are stored electronically readable control signals which interact or can interact with a programmable computer system in such a way that the respective method is carried out. Therefore, the digital storage medium can be computer-readable. Some exemplary embodiments according to the invention therefore comprise a data carrier having electronically readable control signals that are able to interact with a programmable computer system in such a way that one of the methods described herein is carried out.

In general, embodiments of the present invention can be implemented as a computer program product comprising a program code, wherein the program code is effective to the extent of carrying out one of the methods if the computer program product runs on a computer. The program code can, for example, also be stored on a machine-readable carrier which is a non-transitory medium.

Other embodiments comprise the computer program for carrying out one of the methods described herein, wherein the computer program is stored on a machine-readable carrier.

In other words, one embodiment of the method according to the invention is therefore a computer program comprising a program code for carrying out one of the methods described herein if the computer program runs on a computer. A further embodiment of the methods according to the invention is therefore a data carrier (or a digital storage medium or a computer-readable medium) on which the computer program for carrying out one of the methods described herein is recorded.

A further embodiment of the method according to the invention is therefore a data stream or a sequence of signals which represents or represent the computer program for carrying out one of the methods described herein. The data stream or the sequence of signals can be configured, for example, to the effect of being transferred via a data communication link, for example via the Internet.

A further embodiment comprises a processing device, for example a computer or a programmable logic device, which is configured or adapted to the effect of carrying out one of the methods described herein.

A further embodiment comprises a computer on which the computer program for carrying out one of the methods described herein is installed.

In some embodiments, a programmable logic device (for example a field-programmable gate array, an FPGA) can be used to carry out some or all functionalities of the methods described herein. In some exemplary embodiments, a field-programmable gate array can interact with a microprocessor in order to carry out one of the methods described herein. In general, the methods in some exemplary embodiments are carried out on the part of an arbitrary hardware device. The latter can be universally useable hardware such as a computer processor (CPU) or hardware specific to the method, such as an ASIC, for example.

The above-described embodiments merely constitute an illustration of the principles of the present invention. It goes without saying that modifications and variations of the arrangements and details described herein will be apparent to other persons skilled in the art. Therefore, the intention is for the invention to be restricted only by the scope of protection of the accompanying patent claims and not by the specific details that have been presented on the basis of the description and the explanation of the embodiments herein.

The invention claimed is:

1. A device for testing a circuit to be tested, comprising:
a syndrome determiner configured to determine an error syndrome bit sequence (s(v')) based on a coded binary word (v'), wherein the error syndrome bit sequence (s(v')) indicates whether the coded binary word (v') is a code word of an error correction code (C) used for coding the coded binary word (v');
a test sequence provider having an input coupled to an output of the syndrome provider, the test sequence provider configured to provide a test bit sequence ($T_i$) to the circuit to be tested, wherein if the error syndrome bit sequence (s(v')) indicates that the coded binary word (v') is a code word of the error correction code (C), then the test bit sequence ($T_i$) is different than the determined error syndrome bit sequence (s(v')); and
an evaluation circuit configured to detect an erroneous processing of the test bit sequence ($T_i$) by the circuit to be tested, based on a test output signal (R($T_i$)') which is provided by the circuit to be tested in response to the test bit sequence ($T_i$).

2. The device as claimed in claim 1, wherein, if the error syndrome bit sequence (s(v')) indicates that the coded binary word (v') is not a code word of the error correction code (C), then the test bit sequence ($T_i$) is the same as the determined error syndrome bit sequence (s(v')).

3. The device as claimed in claim 1, wherein the evaluation circuit is configured to compare the test output signal (R($T_i$)') or a processed or reduced test output signal based on the test output signal (R($T_i$)') with an expected reference test signal (R($T_i$)'), and to detect an erroneous processing of the test bit sequence ($T_i$) if the test output signal (R($T_i$)') or the processed or reduced test output signal does not correspond to the expected reference test signal (R($T_i$)).

4. The device as claimed in claim 1, wherein the test bit sequence ($T_i$) is identical to an error syndrome bit sequence (s(v')) for a coded binary word (v') which is not a code word of the error correction code (C).

5. The device as claimed in claim 1, wherein the circuit to be tested is a decoder configured to generate a correction signal for correcting an erroneous coded binary word or an error type determiner for determining an error type of an erroneous coded binary word.

6. The device as claimed in claim 1, wherein the syndrome determiner is configured to determine the error syndrome bit sequence (s(v')), such that the error syndrome bit sequence (s(v')) is always identical to exactly one predefined error syndrome bit sequence if the coded binary word (v') is a code word of the error correction code (C).

7. The device as claimed in claim 1, wherein the syndrome determiner is configured to determine the error syndrome bit sequence (s(v')), such that the error syndrome bit sequence (s(v')) for a first plurality of code words of the error correction code (C) is identical to a first predefined error syndrome bit sequence and the error syndrome bit sequence (s(v')) for a second plurality of code words of the error correction code (C) is identical to a second predefined error syndrome bit sequence, wherein the first predefined error syndrome bit sequence and the second predefined error syndrome bit sequence differ and the first plurality of code words and the second plurality of code words have no common code words.

8. The device as claimed in claim 7, wherein the test sequence provider has a bit sequence inverter, which is configured to invert the test bit sequence ($T_i$) or the error syndrome bit sequence (s(v')) based on a function (f(v')) of a subset of bits of the coded binary word (v').

9. The device as claimed in claim 8, wherein the function (f(v')) of the subset of bits is chosen such that the bit sequence inverter does not invert the test bit sequence ($T_i$) if the error syndrome bit sequence (s(v')) is identical to the first predefined error syndrome bit sequence, and inverts the test bit sequence ($T_i$) if the error syndrome bit sequence (s(v')) is identical to the second predefined error syndrome bit sequence.

10. The device as claimed in claim 1, wherein the test sequence provider has an error syndrome detector which is configured to provide a test trigger signal that triggers the provision of the test bit sequence ($T_i$) by the test sequence provider if the error syndrome bit sequence (s(v')) is identical to a predefined error syndrome bit sequence, wherein the predefined error syndrome bit sequence indicates that the coded binary word (v') is a code word of the error correction code (C).

11. The device as claimed in claim 10, wherein the test trigger signal is a signal having a width of one bit.

12. The device as claimed in claim 1, wherein the syndrome determiner is configured to determine the error syndrome bit sequence (s(v')) based on a multiplication of a parity check matrix (H) of the error correction code (C) by the coded binary word (v') or a multiplication of a parity check matrix (K) of the error correction code (C) by the coded binary word (v'), wherein the multiplication of the parity check matrix (K) being inverted component by component at least in one column.

13. The device as claimed in claim 1, wherein the test sequence provider is configured to provide a respective test bit sequence ($T_i$) from a plurality of test bit sequences for each coded binary word (v') which the syndrome determiner processes, and which is a code word of the error correction code (C), of the circuit to be tested.

14. The device as claimed in claim 13, wherein the test sequence provider has a memory that stores the plurality of test bit sequences, or has a linear feedback shift register to generate a test bit sequence ($T_i$) of the plurality of test bit sequences.

15. The device as claimed in claim 1, wherein the error correction code (C) is a linear error correction code.

16. The device as claimed in claim 1, wherein the test sequence provider is configured to provide the test bit sequence ($T_i$) to be different than the error syndrome bit sequence (s(v')) in some instances where the error syndrome bit sequence (s(v')) indicates that the coded binary word (v') is a code word of the error correction code (C); and wherein the test sequence provider is configured to provide the test bit sequence ($T_i$) to be the same as the error syndrome bit sequence (s(v')) in other instances where the error syndrome bit sequence (s(v')) indicates that the coded binary word (v') is not a code word of the error correction code (C).

17. The device as claimed in claim 1, wherein the circuit to be tested is a decoder configured to generate the test output signal which represents a correction signal (e) for the coded binary word (v') if the error syndrome bit sequence (s(v')) indicates that the coded binary word (v') is not a code word of the error correction code (C); and
 a correction unit configured to correct a bit error in the coded binary word (v') based on the coded binary word (v') and the correction signal (e) and to output a corrected coded binary word ($v_{corr}$).

18. The device as claimed in claim 17, wherein the correction unit is configured to generate a processed test output signal based on a logical XORing of the correction signal with the coded binary word (v') and to provide the test output signal to the evaluation unit.

19. The device as claimed in claim 18, wherein the evaluation unit has a code checker, wherein the correction unit is configured to generate the processed test output signal based on a logical XORing of an excepted reference test signal ($R(T_i)$) with the result of the logical XORing of the correction signal (e) with the coded binary word (v') if the error syndrome bit sequence (s(v')) indicates that the coded binary word (v') is a code word of the error correction code (C), wherein the code checker is configured to generate an error signal which indicates whether the processed test output signal is a code word of the error correction code (C).

20. A device for testing a circuit to be tested, comprising:
 a means for determining an error syndrome bit sequence configured to determine an error syndrome bit sequence (s(v')) based on a coded binary word (v'), wherein the error syndrome bit sequence (s(v')) indicates whether the coded binary word (v') is a code word of an error correction code (C) used for coding the coded binary word (v');
 a means for providing a test bit sequence ($T_i$), said providing means configured to provide the test bit sequence ($T_i$) to the circuit to be tested, wherein if the error syndrome bit sequence (s(v')) indicates that the coded binary word (v') is a code word of the error correction code (C), then the test bit sequence ($T_i$) is different than the error syndrome bit sequence (s(v')); and
 a means for detecting an erroneous processing, said detecting means configured to detect the erroneous processing of the test bit sequence ($T_i$) by the circuit to be tested, based on a test output signal ($R(T_i)'$) which is provided by the circuit to be tested in response to the test bit sequence ($T_i$).

21. A method for testing a circuit to be tested, comprising:
 determining an error syndrome bit sequence (s(v')) based on a coded binary word (v'), wherein the error syndrome bit sequence (s(v')) indicates whether the coded binary word (v') is a code word of an error correction code (C) used for coding the coded binary word (v');
 providing a test bit sequence ($T_i$) to the circuit to be tested, wherein, if the error syndrome bit sequence (s(v')) indicates that the coded binary word (v') is a code word of the error correction code (C), then the test bit sequence is different than the error syndrome bit sequence (s(v')); and detecting an erroneous processing of the test bit sequence ($T_i$) by the circuit to be tested, based on a test output signal ($R(T_i)'$) which is provided by the circuit to be tested in response to the test bit sequence ($T_i$).

22. A computer program comprising a program code on a non-transitory medium for carrying out the method as claimed in claim 21.

* * * * *